United States Patent
Fritze et al.

(10) Patent No.: US 9,548,798 B2
(45) Date of Patent: Jan. 17, 2017

(54) NEAR FIELD MEASUREMENT OF ACTIVE ANTENNA SYSTEMS

(71) Applicant: KATHREIN-WERKE KG, Rosenheim (DE)

(72) Inventors: Stefan Fritze, Rosenheim (DE); Karl-August Steinhauser, München (DE)

(73) Assignee: KATHREIN-WERKE KG, Rosenheim (DE)

( * ) Notice: Subject to any disclaimer, the term of this patent is extended or adjusted under 35 U.S.C. 154(b) by 0 days.

(21) Appl. No.: 15/007,816

(22) Filed: Jan. 27, 2016

(65) Prior Publication Data
US 2016/0218776 A1 Jul. 28, 2016

(30) Foreign Application Priority Data
Jan. 27, 2015 (DE) .................. 10 2015 001 002

(51) Int. Cl.
*H04B 17/00* (2015.01)
*H04W 24/00* (2009.01)
(Continued)

(52) U.S. Cl.
CPC ......... *H04B 5/0043* (2013.01); *G01R 29/0871* (2013.01); *H04B 17/21* (2015.01); *G01R 29/10* (2013.01); *G01R 29/105* (2013.01)

(58) Field of Classification Search
CPC ............. H04B 1/04; H04B 1/40; H04B 17/00; H04B 17/0085; H04B 17/15; H04B 17/19; H04B 17/20; H04W 24/06; H04W 72/085
(Continued)

(56) References Cited

U.S. PATENT DOCUMENTS 5,066,921 A 11/1991 Rope et al.
5,809,087 A 9/1998 Ashe et al.
(Continued)

FOREIGN PATENT DOCUMENTS

EP 2 811 307 A1 12/2014
GB 2531310 A 4/2016
WO 2016/059140 A1 4/2016

OTHER PUBLICATIONS

C. Balanis, "Antenna Theory; Analysis and Design, 3rd Edition", ISBN: 978-0471-66782-7, 2005.
(Continued)

*Primary Examiner* — Quochien B Vuong
(74) *Attorney, Agent, or Firm* — Nixon & Vanderhye P.C.

(57) ABSTRACT

Method for determining the magnitude and phase of a signal received by the active antenna (3). From the group of method steps:
ST1: only transmission ($S_1$) of the transmission signal by the at least one transmitting antenna (6) and capture ($S_{1\_1}$) of a power value of the transmission signal received by the active antenna (3);
ST2: only transmission ($S_2$) of the transmission signal by the reference antenna (2) and capture ($S_{2\_1}$) of a power value of the transmission signal received by the active antenna (3);
ST3: simultaneous transmission ($S_3$) of the transmission signal by means of the at least one transmitting antenna (6) and the reference antenna (2) while generating superimposed transmission signals and capture ($S_{3\_1}$) of a power value of the superimposed transmission signals received by the active antenna (3);
a sequence of at least three method steps (ST1, ST2, ST3) is carried out in any order and in any combination, with at least one method step (ST1, ST2, ST3) being carried out multiple
(Continued)

times, wherein the sequence of the at least three method steps (ST1, ST2, ST3) always comprises the method step ST3 at least once.

24 Claims, 12 Drawing Sheets

(51) Int. Cl.
*H04B 5/00* (2006.01)
*G01R 29/08* (2006.01)
*H04B 17/21* (2015.01)
*G01R 29/10* (2006.01)

(58) Field of Classification Search
USPC .......... 455/41.1, 41.2, 67.11, 423, 424, 425; 343/703, 753, 757
See application file for complete search history.

(56) References Cited

U.S. PATENT DOCUMENTS

| | | | | |
|---|---|---|---|---|
| 6,603,435 | B2* | 8/2003 | Lindenmeier | H01Q 23/00 343/713 |
| 6,657,596 | B2* | 12/2003 | Djuknic | G01R 29/10 343/703 |
| 8,525,744 | B2* | 9/2013 | Teshirogi | G01R 29/0821 343/703 |
| 8,565,347 | B2* | 10/2013 | Blech | H04B 17/12 375/300 |
| 2003/0117315 | A1 | 6/2003 | Graham | |
| 2013/0099985 | A1 | 4/2013 | Gross | |
| 2014/0300519 | A1 | 10/2014 | Estebe et al. | |
| 2015/0226777 | A1* | 8/2015 | Qian | G01R 29/10 343/703 |

OTHER PUBLICATIONS

R4-145044, "Near Field Measurement Setups for AAS BS OTA testing: 3GPP TSG-RAN4—Meeting #72", Aug. 18-22, 2014, 3 pages.
R. Tkadlec et al., Radioengineering, "Radiation Pattern Reconstruction from the Near-Field Amplitude Measurement on Two Planes using PSO" vol. 14, No. 4, Dec. 2005, 5 pages.
R4-136580, "Spherical Near-Field Scanning Methods", 3GPP TSG-RAN WG4 meeting #69bis, San Francisco, USA Nov. 11-15, 2013, 2 pages.
R4-142684, "Near Field Measurement Technique and Preliminary Results for Radiated AAS BS testing", 3GPP TSG-RAN4 Meeting #71, Seoul, Korea, May, 19-23, 2014, 25 pages.
S. Costanzo et al., "Advanced Numerical Techniques for Near-Field Antenna Measurements", University of Calabria, Numerical Simulations of Physical and Engineering Processes, Sep. 2011, 19 pages.
L.J. Foged et al., "Efficient Testing of Wireless Devices form 800 MHz to 18 GHz", Radioengineering, vol. 18, No. 4, Dec. 2009, 7 pages.
Hess, D.W., et al., "Measurement of Antenna Performance for Active Array Antennas with Spherical Near-Field Scanning," MI Technologies, Apr. 2008, 5 pages.
Hui, Hon Tat, "Antenna Measurement," NUS/ECE, EE6832, 1990, 12 pages.
European Search Report dated Jun. 9, 2016, issued in European Patent Application No. 16151816.2.

* cited by examiner

NEAR FIELD MEASUREMENT OF ACTIVE ANTENNA SYSTEMS

CROSS-REFERENCE TO RELATED APPLICATIONS

None.

STATEMENT REGARDING FEDERALLY SPONSORED RESEARCH OR DEVELOPMENT

None.

FIELD

The invention relates to a method and a measuring device for determining the magnitude and phase of a signal received by an active antenna to be examined on the basis of measured power values. On the basis of the captured magnitude and the phase it is then possible to determine the antenna far field pattern.

BACKGROUND AND SUMMARY

Various methods are available for this purpose. The antenna far field pattern can be determined for example by means of a far field measurement. In practice, however, such a far field measurement is not very practicable, since it would be disrupted by many other devices. A further possibility lies in the use of a compact range chamber, and a plane wave can be generated for the measurement by means of a feedhorn and a mirror. However, such a structure may be very large in terms of the dimensions and the measurement chamber as a whole may be very expensive, so that such a method is also not very practicable in practice.

Therefore a near field measurement is predominantly carried out because it functions with relatively small chamber sizes. If shielded measurement chambers are used, then the measurements can be carried out completely independently of external RF services and interference sources. With such a near field measurement the antenna to be examined is measured in the measurement chamber. If both the magnitude and also the phase are captured over the entire solid angle or over selected ranges, the required antenna far field pattern can be mathematically determined therefrom. This takes place by means of a near field/far field transformation.

However, such near field measurement is problematic in the case of active antenna systems (AAS) in which the RF connection between antenna and radio is not usually accessible. Here the necessary data must be extracted or fed in at the usual digital interface. Normally only the power of the transmission or reception signal is available at this interface. On the other hand, the phase information can only be extracted with great difficulty or not at all. For this purpose a collaboration with the manufacturer of the active antenna system is generally necessary. Without phase information, however, the near field/far field transformation cannot be carried out.

However, in the case of an active antenna system the combination of antenna and radio electronics is measured. In this case the transmission direction and the reception direction must be measured separately because they relate to different electronic components.

Within the standardization committee of 3GPP this problem has already been discussed under R4-145044, "Near Field Measurement Setups for AAS BS OTA testing: 3GPP TSG-RAN4-Meeting #72". A method was proposed there in which a reference antenna together with the active antenna system to be examined is moved by a rotary arrangement, so that different solid angles can be set in relation to a transmitting antenna. If the active antenna system acts as a transmitter, the required phase information can be determined by direct comparison of the phases of the RF signals from the reference antenna and the transmitting antenna which in this case acts as a receiver.

However, the problem of how to proceed in the reception direction, i.e. if the active antenna system functions as a receiver, is not solved. Moreover, a further problem is how to ensure, during the entire duration of the measurement over all solid angles, that the phase is not delayed, which is not ensured because of temperature drifts of the electronics of the active antenna system. In addition a synchronization between the separate transmitter and the receiver of the active antenna system would be necessary.

Therefore the object of the invention is to create a method and a measuring arrangement by which it is possible to determine the magnitude and the phase of an active antenna system, wherein the active antenna system functions as a receiver.

With regard to the method for determining the power values of a signal received by the active antenna in order thus to be able to determine the magnitude and the phase, the object is achieved by the features of claim 1. With regard to the measuring device for determining the power values of a signal received by the active antenna for calculation of the magnitude and the phase, the object is achieved by the features of claim 13. Advantageous modifications of the method according to the invention, as well as the measuring device according to the invention, are specified in the respective subordinate claims.

The method according to the invention for determining the power values of a signal received by the active antenna in order thus to be able to determine the magnitude and the phase provides that in addition to at least one transmitting antenna a reference antenna is also used, wherein this latter is disposed at a predetermined distance from the active antenna, and that additionally a signal generator is used which is connected to the at least one transmitting antenna and to the reference antenna and generates a transmission signal. Within the method, from the group of the following method steps:

ST1: only transmission of the transmission signal by the at least one transmitting antenna and capture of a power value of the transmission signal received by the active antenna;

ST2: only transmission of the transmission signal by the reference antenna and capture of a power value of the transmission signal received by the active antenna;

ST3: simultaneous transmission of the transmission signal by means of the at least one transmitting antenna and the reference antenna while generating superimposed transmission signals and capture of a power value of the superimposed transmission signals received by the active antenna;

a sequence of at least three method steps ST1, ST2, ST3 is carried out in any order and in any combination, with at least one method step ST1, ST2, ST3 being carried out multiple times, wherein the sequence of the at least three method steps ST1, ST2, ST3 always comprises the method step ST3 at least once. Because the method step ST3 is carried out at least once, the phase can be determined with the aid of at least three measured power values. The required magnitude can be determined directly when ST1 is carried out or with the aid of the three measured power values, if ST1 is not carried out.

The measuring device for determining the power values of a signal received by an active antenna for calculation of the magnitude and phase comprises the features already mentioned. Such a measuring device also comprises a reference antenna in addition to at least one transmitting antenna, wherein the reference antenna, as already explained, is disposed at a fixed unchangeable distance and direction with respect to the active antenna. Moreover, the measuring device comprises a signal generator which can generate the transmission signal. In this case the signal generator is preferably connected both to the at least one transmitting antenna and also to the reference antenna. Furthermore, the measuring device has a control unit which is designed in such a way that it can carry out the following method steps:

ST1: only transmission of the transmission signal by the at least one transmitting antenna and capture of a power value of the transmission signal received by the active antenna;

ST2: only transmission of the transmission signal by the reference antenna and capture of a power value of the transmission signal received by the active antenna;

ST3: simultaneous transmission of the transmission signal by means of the at least one transmitting antenna and the reference antenna while generating superimposed transmission signals and capture of a power value of the superimposed transmission signals received by the active antenna.

Furthermore, the control unit is designed so that a sequence of at least three method steps ST1, ST2, ST3 is carried out in any order and in any combination, with at least one method step ST1, ST2, ST3 being carried out multiple times, wherein the sequence of the at least three method steps ST1, ST2, ST3 always comprises the method step ST3 at least once.

Furthermore, the method according to the invention and the measuring device according to the invention put the sequences in concrete terms in such a way that the corresponding following method steps are carried out in any order for each of the sequences a), b), c) described by way of example. The method step ST1 or ST2 is carried out within the sequence a). The method ST3 is also carried out which is repeated as often as required until at least three power values are captured. The method steps ST1, ST2 and ST3 are carried out within the sequence b). In the sequence c) the method step ST3 is carried out as often as required until at least three power values are captured. These sequences a), b), c) with their respective method steps enable the calculation of power values, with which the required magnitude and the required phase can be determined in a very simple manner.

The method according to the invention and the measuring device according to the invention describe the sequences a), b) and c) in greater detail below. Moreover, in the sequence a) a phase controller and/or amplitude controller is advantageously also used, or the measuring device advantageously also has such a phase controller and/or amplitude controller. After the method step ST3 has been carried out, a phase change is carried out between the transmission signal on the at least one transmitting antenna and the transmission signal on the reference antenna and/or an amplitude change of the transmission signal on the at least one transmitting antenna and/or of the transmission signal on the reference antenna is carried out. After this the method steps ST3 and the phase change and/or amplitude change are carried out again until at least one power value in each case is captured for at least two different phase values between the transmission signal on the at least one transmitting antenna and the transmission signal on the reference antenna and/or for at least two different amplitude values of the transmission signal on the at least one transmitting antenna and/or of the transmission signal on the reference antenna. Thus with the captured power values from the method step ST1 or ST2 three power values are provided. By means of the at least three power values it is possible to calculate the phase difference on the active antenna between the transmission signal which was transmitted by the at least one transmitting antenna and the transmission signal which was transmitted by the reference antenna. The magnitude of the transmission signal which was transmitted by the at least one transmitting antenna and was received by the active antenna can also be easily determined. This signal is either taken directly from the measured power value from the method step ST1, if this was carried out, or it is calculated from the at least three power values, of which at least two have been determined from the superimposed transmission signal.

Within the sequence b) it is only made clear that the phase is calculated from the at least three power values and that the magnitude is determined from the measured output in the method step ST1.

Likewise, in the sequence c) a phase controller and/or amplitude controller is advantageously used, or the measuring device advantageously also has such a phase controller and/or amplitude controller. After the method step ST3 has been carried out, a phase change is carried out between the transmission signal on the at least one transmitting antenna and the transmission signal on the reference antenna and/or an amplitude change of the transmission signal on the at least one transmitting antenna and/or of the transmission signal on the reference antenna is carried out. After this the method steps ST3 and the phase change and/or amplitude change are carried out again until at least one power value in each case is captured for at least two different phase values between the transmission signal on the at least one transmitting antenna and the transmission signal on the reference antenna and/or for at least three different amplitude values of the transmission signal on the at least one transmitting antenna and/or of the transmission signal on the reference antenna. The required phase and the required magnitude are determined by means of the at least three power values.

Moreover, an advantage according to the invention is provided when in the method and in the measuring device the capture of the power and the phase change and/or amplitude change are carried out one after the other as often as required until at least one power value in each case is captured for at least three or at least four different phase values between the transmission signal on the at least one transmitting antenna and the transmission signal on the reference antenna and/or for at least three different amplitude values of the transmission signal on the at least one transmitting antenna and/or of the transmission signal on the reference antenna. This enables a reliable determination of the phase also in the event that the amplitude of the two transmission signals has a markedly different level.

Moreover, it is particularly advantageous if the method and the measuring device are capable of turning and/or moving a unit which is formed by the active antenna and the reference antenna jointly relative to the at least one transmitting antenna. In this case different reception directions, that is to say different solid angles, can be measured. It is important that the reference antenna and the active antenna do not rotate and/or move with respect to one another. Furthermore the method and the measuring device can repeat the previous method steps, so that the magnitude and the phase can be determined for a different solid angle. In this case it is particularly advantageous if both the azimuth angle and also the angle of elevation of the unit formed by the active antenna and the reference antenna are turned and/or moved relative to the at least one transmitting antenna. In this case all solid angles of the active antenna can be measured. The active antenna can therefore be swiveled in two axes of rotation.

The method and the measuring device are then capable of rotating the active antenna together with the reference antenna until the magnitude and the phase have been determined for all solid angles or until the magnitude and the phase have been determined only for the required solid angles.

Both for the measuring device and also for the method it is particularly advantageous if four successive phase changes of 0°, Δ°, 2·Δ° and 3·Δ°, wherein Δ° is in the range between 80° and 100° and preferably corresponds to 90°, are applied between the transmission signal of the at least one transmitting antenna and the transmission signal on the reference antenna. An application of a further phase difference of 90° in each case can be achieved particularly simply by means of hybrids, inverters or selector switches. In this case care should be taken to ensure that, depending upon the length of the cables which are used from the RF generator to the at least one transmitting antenna and to the reference antenna, already from the outset there is a phase shift between the two transmission signals exists. Therefore the phase controller does not set a phase shift of for example exactly 90° between the transmission signal of the at least one transmitting antenna and the transmission signal of the reference antenna at the location of the active antenna, but only increases a possibly existing phase offset by a further 90°.

Moreover there is an advantage if within the method and within the measuring device an amplitude controller is used which is connected between the signal generator and the at least one transmitting antenna and/or between the signal generator and the reference antenna. By means of the amplitude controller it is possible to set the amplitude of the transmission signal on the at least one transmitting antenna and/or the amplitude of the transmission signal on the reference antenna in such a way that the power of the transmission signal of the at least one transmitting antenna corresponds approximately to the power of the transmission signal of the reference antenna on the active antenna. Therefore the power levels of both transmission signals on the active antenna are preferably the same. However, it is sufficient if the power of a transmission signal is less than 20 times as high, preferably less than ten times as high, or more preferably less than five times as high, or more preferably less than twice as high, as the power of the other transmission signal. In this case the phase for a solid angle can be calculated particularly accurately.

Furthermore in the method according to the invention and in the measuring device according to the invention it is advantageous if the at least one transmitting antenna and/or the reference antenna transmit a modulated or unmodulated transmission signal. This also makes it possible to measure active antennas which only operate with modulates signals.

Ultimately in the method according to the invention and in the measuring device according to the invention it is advantageous if the reference antenna is disposed particularly close to the active antenna, the distance between them being in particular less than 100 cm, preferably less than 50 cm, more preferably less than 25 cm and more preferably less than 10 cm.

BRIEF DESCRIPTION OF THE DRAWINGS

Various exemplary embodiments of the invention are described below by way of example with reference to the drawings. Items which are the same have the same reference numerals. The corresponding figures of the drawings show in detail.

DETAILED DESCRIPTION OF NON-LIMITING EMBODIMENTS

Figure 1:
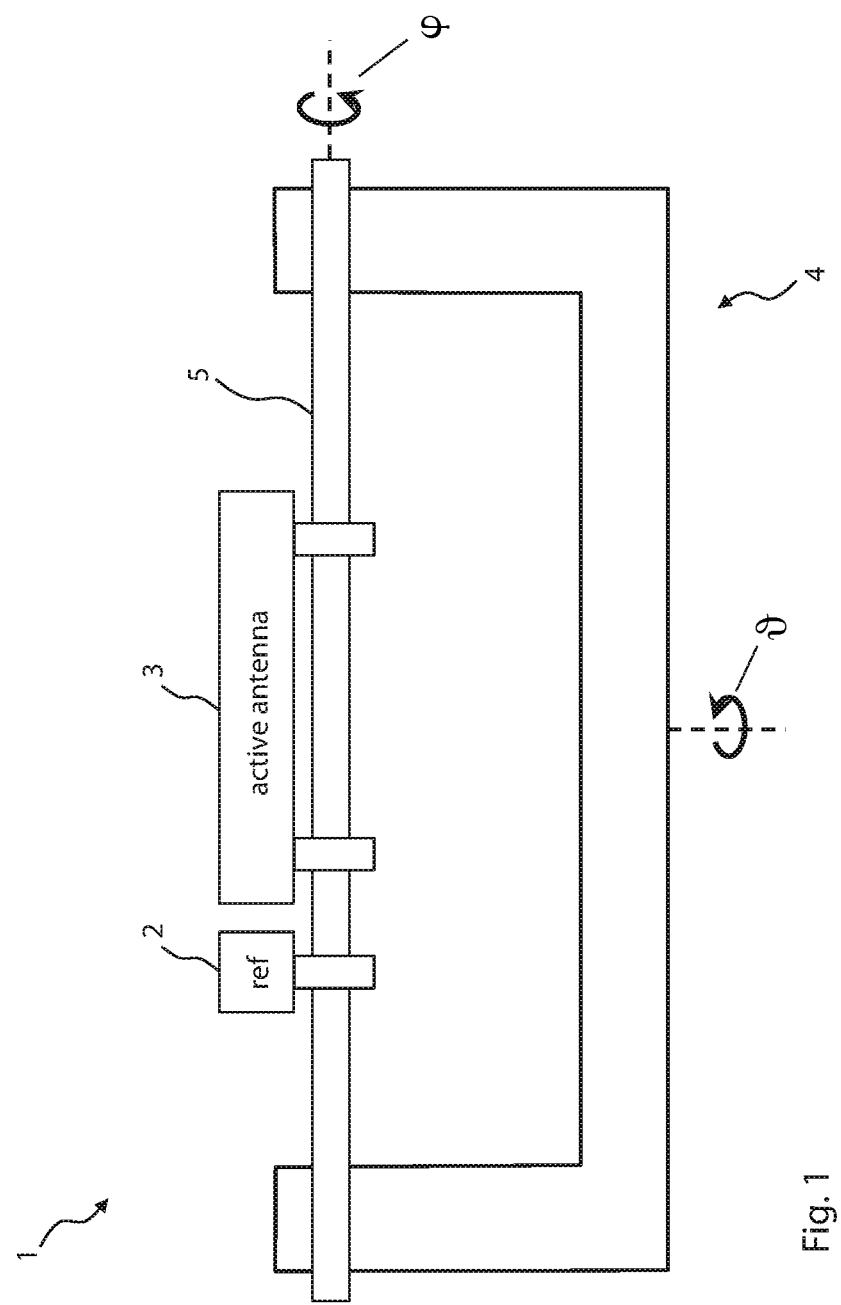
FIG. 1: a simplified representation of the measuring device which clarifies the arrangement of the reference antenna on the active antenna.

FIG. 1 shows a simplified representation of the measuring device 1 which clarifies the arrangement of the reference antenna on the active antenna 3. Both the reference antenna 2 and also the active antenna 3 are disposed on a rotating unit 4. The rotating unit 4 makes it possible for the reference antenna 2 and the active antenna 3 to be rotated and/or adjusted together. In this case the rotation and/or adjustment is possible with two axes of rotation $\theta$, $\phi$. This makes it possible for the active antenna 3 and the reference antenna 2, which are illustrated with respect to their possible movement as a combined unit, to be rotated and/or adjusted with respect to their azimuth angle $\phi$ and/or their angle of elevation $\theta$ relative to a transmitting antenna 6 not illustrated in FIG. 1.

The reference antenna 2 and the active antenna 3 are fastened to an antenna mount 5. This antenna mount 5 is appropriately connected mechanically to the rotating unit 4 or is inserted therein. The reference antenna 2 is disposed as close as possible to the active antenna 3. The spacing between the reference antenna 2 and the active antenna 3 is less than 100 cm, preferably less than 50 cm, more preferably less than 25 cm and more preferably less than 10 cm. The main emission direction of the reference antenna 2 should point in the direction of the active antenna 3 exhibit.

The reference antenna 2 and the active antenna 3 always have the same orientation, that is to say they are oriented rigidly with respect to one another. This means, that with the rotating unit 4 it is not possible to rotate the reference antenna 2 with respect to the active antenna 3 or vice versa. The rotating unit 4 makes it possible for only a unit formed by the reference antenna 2 and the active antenna 3 to be rotated and/or adjusted relative to the surroundings, also including the transmitting antenna 6.

The rotating unit 4 contains for example a stepping motor. Because both the azimuth angle $\phi$ and also the angle of elevation $\theta$ of the unit consisting of the reference antenna 2 and the active antenna 3 can be changed, the magnitude and the phase can be measured for all the solid angles $\theta$, $\phi$ of the active antenna 3.

An active antenna is an antenna in which the RF connection between the actual antenna and the radio does not have to be accessible. The received data must be extracted or fed in at the usual digital interface. In such an active antenna system 3 only the power of the transmission or reception signal is generally available at this interface. On the other hand, the phase information cannot be extracted or can only be extracted with great difficulty with the aid of the manufacturer of the active antenna 3. As already explained, however, without the phase information a near field/far field transformation is not possible. The reciprocity of the active antenna 3 is not provided, because different filters and electronic components are used within the transmission and reception path. Therefore, as already explained, in addition to the transmission direction the reception direction must also be measured separately.

The reference antenna 2 and the active antenna 3 are coupled to one another by means of an antenna mount 5. The spacing between the reference antenna 2 and the active antenna 3 can be changed by release of a locking connection, such as for example a clamp connection, on the reference antenna 2 and/or on the active antenna 3. When the locking connection is released, the reference antenna 2 and/or the active antenna 3 can be moved to and fro on the antenna mount 5. During the measurement of the magnitude and the phase over all solid angles $\theta$, $\phi$ the locking connection can be tightened, so that the relative position of the reference antenna 2 and the active antenna 3 with respect to one another cannot change.

Figure 2A:
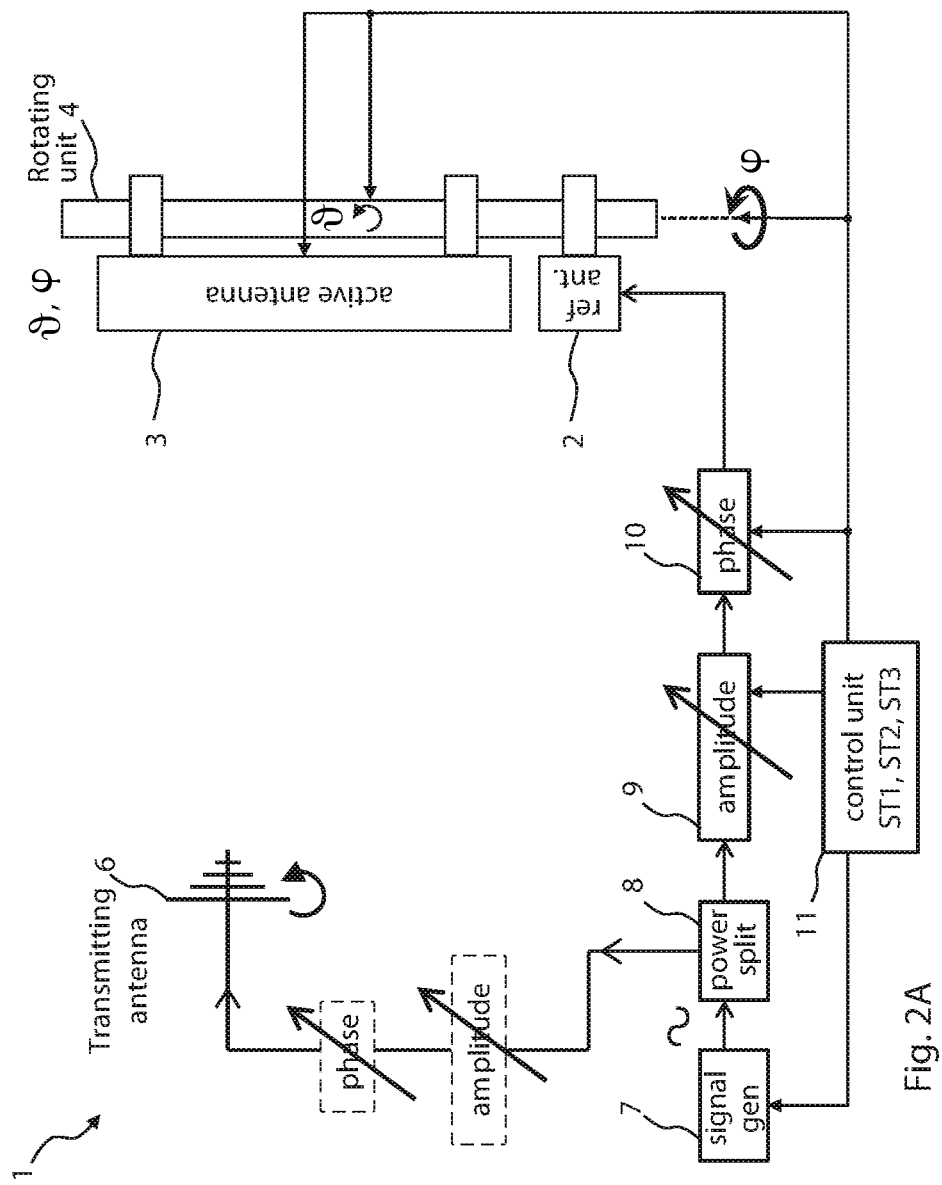
FIG. 2A: a simplified representation of the measuring device which clarifies the interaction of different components, such as for example the signal generator, the at least one transmitting antenna, the phase controller and the control unit together with the active antenna and the reference antenna.

FIG. 2A shows a further simplified representation of the measuring device 1 and the structure on which it is based. As already explained, the measuring device 1 consists of a rotating unit 4 as well as a reference antenna 2 and the active antenna 3 to be examined. Moreover, the measuring device 1 also comprises a transmitting antenna 6 which is spaced apart from the active antenna 3 and the reference antenna 2. As made clear by the arrows in FIG. 2A, the reference antenna 2 and the active antenna 3 can be rotated and/or adjusted relative to the transmitting antenna 6. In this case the reference antenna 2 and the active antenna 3 always have the same orientation with respect to one another. Additionally or alternatively it is also possible for the transmitting antenna 6 to be rotated and/or adjusted relative to the unit consisting of the reference antenna 2 and the active antenna 3. For example the polarization of the transmitting antenna 6 can be changed. A transmitting antenna 6, for example in the form of a log-periodic antenna, can be rotated by 90° for this purpose. The reference antenna 2 is usually disposed closer to the active antenna 3 than the transmitting antenna 6.

Furthermore the measuring device 1 has a signal generator 7. This can generate a transmission signal which may for example be a simple sinusoidal signal. The signal generator 7 is preferably connected to a power splitter 8. The power splitter 8 splits the input signal which it receives from the signal generator 7, for example into two output signals of equal magnitude. One output of the power splitter is connected to the transmitting antenna 6. A second output of the power splitter is connected to the reference antenna 2.

In the exemplary embodiment according to FIG. 2A an amplitude controller 9 and a phase controller 10 are also disposed in the signal path between the second output of the power splitter 8 and the reference antenna 2. The second output of the power splitter 8 is preferably connected to an input of the amplitude controller 9. An output of the amplitude controller 9 is connected to an input of the phase controller 10, an output of the phase controller 10 being connected to the reference antenna 2. The arrangement of the amplitude controller 9 and of the phase controller 10 can also be implemented in reverse.

The amplitude controller 9 and the phase controller 10 can also be disposed in the signal path between the first output of the power splitter 8 and the transmitting antenna 6. It is also possible for the amplitude controller 9 and the phase controller 10 to be disposed both in the first signal path, that is to say between the first output of the power splitter 8 and the transmitting antenna 6, and also in the second signal path, that is to say between the second output of the power splitter 8 and the reference antenna 2. The amplitude controller 9 and the phase controller 10 could also be distributed over the two signal paths.

The amplitude controller 9 makes it possible to increase and/or to lower the amplitude of a transmission signal delivered to it. For this purpose the amplitude controller 9 has either corresponding attenuators and/or corresponding amplifier elements. Advantageously, however, the amplitude controller 9 is not absolutely necessary and therefore can also be completely omitted.

By means of the phase controller 10 a transmission signal delivered to its input is output with a delay at its output. The phase controller 10 is preferably designed in such a way that a transmission signal delivered to it at the input is either output without a delay, that is to say that the transmission signal has a phase difference of 0° at its output by comparison with the transmission signal at its input. However, in the phase controller 10 it is also possible that the transmission signal at its output has a phase difference of $\Delta°$, $2·\Delta°$ and/or $3·\Delta°$, wherein $\Delta$ preferably corresponds to 90, by comparison with the transmission signal at its input. This means that the phase controller 10 can shift a transmission signal applied to its input by 0°, 90°, 180°, and 270°. Such a phase controller 10 may be constructed in analogue RF technology and can for example contain hybrids, inverters and selector switches. In this case it can be produced very simply and precisely. The phase controller 10 can also be constructed with delay lines. Thus it is possible for phase differences of $\Delta°$ to be set which may for example be in the range from 80° to 100° or may assume any values.

The control unit 11 is the key element of the measuring device 1. The control unit 11 is connected both to the signal generator 7 and also to the amplitude controller 9, the phase controller 10, the rotating unit 4 and the active antenna 3.

In this case the control unit 11 is designed in such a way that it can control the signal generator 7 so that it generates and outputs a transmission signal with a specific frequency and a specific amplitude.

The control unit 11 is likewise connected to the active antenna 3, and can retrieve the measured power values of the received transmission signal from this antenna. As already explained, the control unit 11 does not necessarily have to be capable of retrieving the measured phase values from the active antenna 3, because this is generally not possible without the collaboration of the manufacturer of the active antenna system.

The control unit 11 is also connected to the rotating unit 4 and can communicate to this unit the solid angles $\theta$, $\phi$ which are to be set.

Furthermore the control unit 11 is connected to the amplitude controller 9. The control unit 11 can communicate to the amplitude controller 9 whether this controller should increase or decrease the amplitude of the transmission signal delivered to its input. The control unit 11 preferably regulates the amplitude controller 9 in such a way that the power of the transmission signal of the transmission antenna 6 at the position of the active antenna 3 is less than 20 times as high, preferably less than ten times as high, or more preferably less than five times as high, or more preferably less than twice as high, as the power of the transmission signal of the reference antenna 2 at the position of the active antenna 3. The amplitude controller 9 can also set the amplitude in such a way that the power of the transmission signal of the reference antenna 2 at the position of the active antenna 3 is less than 20 times as high, preferably less than ten times as high, or more preferably less than five times as high, or more preferably less than twice as high, as the power of the transmission signal of the transmission antenna 6 at the position of the active antenna 3. This means that the power levels of the two transmission signals at the position of the active antenna 3 differ by less than the factor 20, preferably by less than the factor ten, more preferably by less than the factor five, more preferably by less than the factor two, more preferably by less than the factor 1.2.

This is achieved for example in that the control unit 11 only transmits a transmission signal via the transmitting antenna 6 and draws the power measured by the active antenna 3. In the next step the control unit 11 would cause the transmission signal to be transmitted only from the reference antenna 2 and likewise would draw the power measured by the active antenna 3. Subsequently it would control the amplitude controller 9, which is disposed either in the signal path between the power splitter 8 and the reference antenna 2 and/or in the signal path between the power splitter 8 and the transmitting antenna 6, in such a way that the power levels of both transmission signals are approximately the same at the position of the active antenna 3.

The control unit 11 is likewise capable of controlling the phase controller 10. The control unit 11 can specify for the phase controller 10 the number of degrees by which the phase should be changed between a signal which is delivered to it at its input and the signal which it emits at its output. Phase changes of 0°, 90°, 180° and 270° can be implemented particularly simply.

As will be explained below, it is particularly helpful that the transmission signal on the reference antenna 2 can be switched off completely, that is to say that the transmitting antenna 6 can transmit only the transmission signal.

It is likewise possible for the signal generator 7, the power splitter 8 (RF splitter), the amplitude controller 9 and the phase controller 10 to be integrated in a common device. In this case the function of the amplitude controller 9 and/or of the phase controller 10 can also be carried out already in the digital part of the baseband. It is important that the relative phase position of the transmission signals on the two paths, that is to say on the path to the transmitting antenna 6 and on the path to the reference antenna 2, does not drift away over the solid angles $\theta$, $\phi$ during the entire solid angle scan, but the set phase values are constant up to an offset value which remains the same.

In order to be able to determine the required magnitude and the required phase for the active antenna 3 there are various sequences. With the same orientation and position of the active antenna 3 and the reference antenna 2 in relation to the transmitting antenna 6, a control unit 11 is designed and connected to the active antenna 3 and the signal generator 7 in such a way that the following method steps:

ST1: only transmission $S_1$ of the transmission signal by the transmitting antenna 6 and capture $S_{1\_1}$ of a power value of the transmission signal received by the active antenna 3;

ST2: only transmission $S_2$ of the transmission signal by the reference antenna 2 and capture $S_{2\_1}$ of a power value of the transmission signal received by the active antenna 3;

ST3: simultaneous transmission $S_3$ of the transmission signal by means of the transmitting antenna 6 and the reference antenna 2 while generating superimposed transmission signals and capture $S_{3\_1}$ of a power value of the superimposed transmission signals received by the active antenna 3.

Furthermore, the control unit is designed so that a sequence of at least three method steps ST1, ST2, ST3 is carried out in any order and in any combination, also with at least one method step ST1, ST2, ST3 being carried out multiple times, wherein the sequence of the at least three method steps ST1, ST2, ST3 always comprises the method step ST3 at least once.

Three different sequences a), b) and c) which result from the above combination are set out below by way of example. Within these sequences, which are described in greater detail below, it is explained how the power levels, from which the required magnitude and the required phase are calculated, are determined. There may also be further sequences which are not referred to here. Furthermore, in the method according to the invention and in the measuring device 1 according to the invention it is advantageous if in the sequences a) and/or c) the amplitude controller 9 is adjusted instead of or in addition to the phase controller 10, wherein the amplitude controller 9 is connected between the signal generator 7 and the at least one transmitting antenna 6 and/or between the signal generator 7 and the reference antenna 2.

A first sequence a) proposes that within the measurement at the start only the transmitting antenna 6 or only the reference antenna 2 transmits a transmission signal which is received by the active antenna 3. The active antenna 3 transmits a power value for the received signal to the control unit 11. This means that either the method step ST1 or the method step ST2 is carried out. This involves the required magnitude of the active antenna 3, if only the transmitting antenna 6 has transmitted. If only the reference antenna 2 has transmitted the transmission signal, then the required magnitude can be determined together with the following measured results, that is to say with the following power values.

Moreover the power value can also be determined in that for example a data throughput measurement is carried out. In this case the magnitude of the data throughput correlates with the power. Therefore if within this description reference is made to determination or capture of the power level, then this can also take place via the data throughput measurement or other values provided by the manufacturer of the active antenna.

Furthermore, both the transmitting antenna 6 and also the reference antenna 2 in each case transmit a transmission signal. The active antenna 3 receives the coherent superimposition of the two transmission signals and supplies a measured power value to the control unit 11. This situation is summarized in the method step ST3.

Such a measurement takes place for example for different settings of the phase controller 10 and/or of the amplitude controller 9. For example the phase controller 10 is controlled by the control unit 11 in such a way that the signal at its input has no phase offset with respect to the signal at its output. For a specific solid angle θ, φ the active antenna 3 outputs the power value of the superimposed transmission signals to the control unit 11. Subsequently the control unit 11 will control the phase controller 10 in such a way that this controller changes the phase by Δ° with respect to the signal at its input and the signal at its output. Once again at least one measured power value of the superimposed transmission signals is transmitted by the active antenna 3 to the control unit 11. The method step ST3 is therefore carried out multiple times. This occurs until for each solid angle θ, φ the control unit has received at least two power measurement values for two different settings of the phase controller 10 and/or of the amplitude controller 9.

This means that the power levels of the two transmission signals at the location of the active antenna 3 are approximately the same as each other, that is to say they differ by less than the factor 20, preferably by less than the factor ten, more preferably by less than the factor five, more preferably by less than the factor two, more preferably by less than the factor 1.2. Alternatively the amplitude controller 9 can also be used in order to change the power of the transmission signal on the transmitting antenna 6 and/or of the transmission signal on the reference antenna 2 in a targeted manner.

In order to obtain a more accurate measurement, three measured values for the power are preferably determined in the method step ST3, wherein this takes place at three different settings of the phase controller 10 and/or of the amplitude controller 9.

The phase difference can be determined between the path via the transmitting antenna 6 and the path via the reference antenna 2 with at least three known measured values. Preferably, however, at least one respective power value of the receiver of the active antenna 3 is measured at four different phase offsets, that is to say the phase controller 10 is controlled in such a way that for example it sets a further additional phase offset and thus for example four phase values of 0°, 90°, 180° and 270° are set. This produces the required phase difference for the corresponding set solid angles θ, φ. The result is also the same if the amplitude controller 9 is used. The amplitude controller can also set three or four different amplitudes for the transmission signal on the transmitting antenna 6 and/or the reference antenna 2.

In the case where only the reference antenna 2 has transmitted the transmission signal at the start, with the measured power for this transmission signal and the at least two further measured power values for the superimposed transmission signal, that is to say with a total of three measured power values, the magnitude of the transmission signal which has been transmitted by the transmitting antenna 6 can be calculated.

Subsequently the control unit 11 controls the rotating unit 4 in such a way as to produce a new solid angle θ, φ to be measured. For this purpose the magnitude and the phase of the active antenna 3 is likewise determined.

Naturally, the phase controller 10 can also set other phase values. It is merely important that different power values have been measured with at least two, preferably three, more preferably four or more different phase values. However, the further apart the individual phase values are from one another, the more accurately the phase can be determined.

It is explained below how the required phase values are calculated with the aid of the measured magnitude, that is to say the measured power values. The following applies for a signal on the active antenna 3 which is transmitted by the transmitting antenna 6:

$$S_S(\theta,\phi)=A_S(\theta,\phi)\cos[\omega t+\gamma(\theta,\phi)+\gamma_{AAS}(t)]$$

with $A_S(\theta,\phi)$ and $\gamma(\theta,\phi)$, which represent the required amplitudes and phase values which are required for a near field/far field transformation. $\omega=2\pi f$, with f=frequency and $\gamma_{AAS}(t)$=phase drift of the active antenna 3, which can be set for example by heating of the components or jitter.

For the signal which has been received by the active antenna 3 and has been transmitted by the reference antenna 2 the following applies:

$$S_{REF,i}(\theta,\phi)=A_{ref}(\theta,\phi)\cos[\omega t+\gamma_i+\gamma_{AAS}(t)]$$

$A_{ref}(\theta,\phi)$=amplitude of the transmission signal of the reference antenna 2, the magnitude of which corresponds as closely as possible to the amplitude of the transmission signal $A_S(\theta,\phi)$ of the transmitting antenna 6, wherein $\gamma_i$ (i=1, 2, 3, 4) corresponds to the setting of the phase controller 10. The values for $\gamma_i$ can be taken from the following equations. $\gamma_0$ is a constant which can already include a phase offset. The cable length is for example included in this. Furthermore the phase controller 10 sets no phase shift (γ1) or additional phase shifts of +90° (γ2), +180° (γ3) and +270° (γ4), in relation to the value $\gamma_0$, which does not have to be precisely 0°.

$$\gamma_1=\gamma_0, \gamma_2=\gamma_0+\pi/2, \gamma_3=\gamma_0+\pi, \gamma_4=\gamma_0+3/2\pi$$

For the coherent superimposition of the two received transmission signals on the active antenna 3 the following applies:

$$S_{AAS,i}(\theta,\phi)=S_S(\theta,\phi)+S_{Ref,i}(\theta,\phi).$$

The active antenna 3 measures the following power levels, wherein the value $\gamma_{AAS}(t)$ is produced in the mathematical calculation, which is immediately apparent, since only one power level is measured and it is it is irrelevant for this how the phase proceeds, because it is not measured at the output of the active antenna 3.

$$P_{AAS,i}(\theta,\phi)=\langle S_{AAS,i}(\theta,\phi)^2 \rangle_t=\tfrac{1}{2}[A_S^2(\theta,\phi)]+A_S(\theta,\phi)A_{Ref}(\theta,\phi)\cos[\gamma(\theta,\phi)-\gamma_i]$$

By combination in pairs this produces $$P_{AAS,1}(\theta,\phi)-P_{AAS,3}(\theta,\phi)=2A_S(\theta,\phi)A_{Ref}(\theta,\phi)\cos[\gamma(\theta,\phi)-\gamma_0] \text{ and}$$

$$P_{AAS,2}(\theta,\phi)-P_{AAS,4}(\theta,\phi)=2A_S(\theta,\phi)A_{Ref}(\theta,\phi)\sin[\gamma(\theta,\phi)-\gamma_0]$$

Ultimately for the required phase values for the near field/far field transformation the following applies $$\gamma(\vartheta,\varphi) = \gamma_0 + \arctan\left(\frac{P_{AAS,2}(\vartheta,\varphi)-P_{AAS,4}(\vartheta,\varphi)}{P_{AAS,1}(\vartheta,\varphi)-P_{AAS,3}(\vartheta,\varphi)}\right).$$

As already explained, it is possible to carry out a near field/far field transformation by using in addition to the transmitting antenna 6 only one reference antenna 2, wherein in this case only power values have to be obtained from the active antenna 3. In this case the active antenna 3 does not have to transmit any phase values. This simplifies the measurement of active antennas 3 which originate from third party manufacturers.

The transmitting antenna 6 and also the reference antenna 2 can transmit both a modulated signal and also an unmodulated transmission signal. Some active antennas 3 can for example only process modulated transmission signals. In the case where for example signals according to the UMTS standard are used with a bandwidth of 5 MHz in frequency bands above 500 MHz, preferably above 1 GHz, the method according to the invention can be used unchanged, the mean value of the transmission frequencies in the 5 MHz band being used advantageously for the near field/far field transformation. For GSM and also for LTE, with a suitable choice of the LTE Resource blocks (RB) used the bandwidth is considerably smaller than in the case of UMTS, which leads to the described method being applicable to all frequencies which are usual in mobile wireless.

The phase values which the phase controller 10 sets are distributed as uniformly as possible over 360°. For example the phase controller 10 can set phase values for a solid angle $\theta$, $\phi$ one after the other, which are spaced apart from one another by $\alpha°$, wherein $$\alpha° = \frac{360°}{\text{number of phase values}}.$$

A second sequence b) proposes that the transmission signal alone is transmitted by the transmitting antenna 6, the power value of the transmission signal received by the active antenna 3 being retrieved therefrom by the control unit 11. This involves the method step ST1. Subsequently the reference antenna 2 transmits only the transmission signal, wherein here again the power value of the transmission signal received by the active antenna 3 is retrieved therefrom by the control unit 11. This involves the method step ST2. Subsequently thereon transmit both antennas 2, 6 transmit the transmission signal simultaneously, both transmission signals being superimposed. Once again the received power value of the superimposed transmission signal from the active antenna 3 is retrieved by the control unit 11. This involves the method step ST3. This enables the calculation of the phase difference between the transmission signal which was transmitted by the transmitting antenna 6 and the transmission signal which was transmitted by the reference antenna 2. The magnitude of the transmission signal transmitted by the transmitting antenna 6 is determined with reference to the measured power value from the method step ST1 ascertained.

A third sequence c) provides that the transmission signal is transmitted both by the transmitting antenna 6 and also by the reference antenna 2, both transmission signals being superimposed. Then the received power value of the superimposed transmission signal from the active antenna 3 is retrieved by the control unit 11. This involves the method step ST3. By means of the phase controller 10 a phase change between the transmission signal to the transmitting antenna 6 and the transmission signal to the reference antenna 2 is advantageously carried out and once again a power value is measured. Alternatively or in addition the power of the transmission signal of the transmitting antenna 6 and/or the power of the signal of the reference antenna 2 is changed by the amplitude controller 9. The described adjustment of the phase controller 10 and/or amplitude controller 9 and the described determination of the power values is repeated again until at least three power values are captured which have been determined by three different settings of the phase controller 10 and/or of the amplitude controller 9. In this case it is sufficient if the phase controller 10 and the amplitude controller 9 adjust the transmission signal a total of three times. This means that for example two different settings of the phase controller 10 and a changed setting of the amplitude controller 9 are sufficient. Both the magnitude and also the phase are calculated with reference to the three measured power values.

Figure 2B:
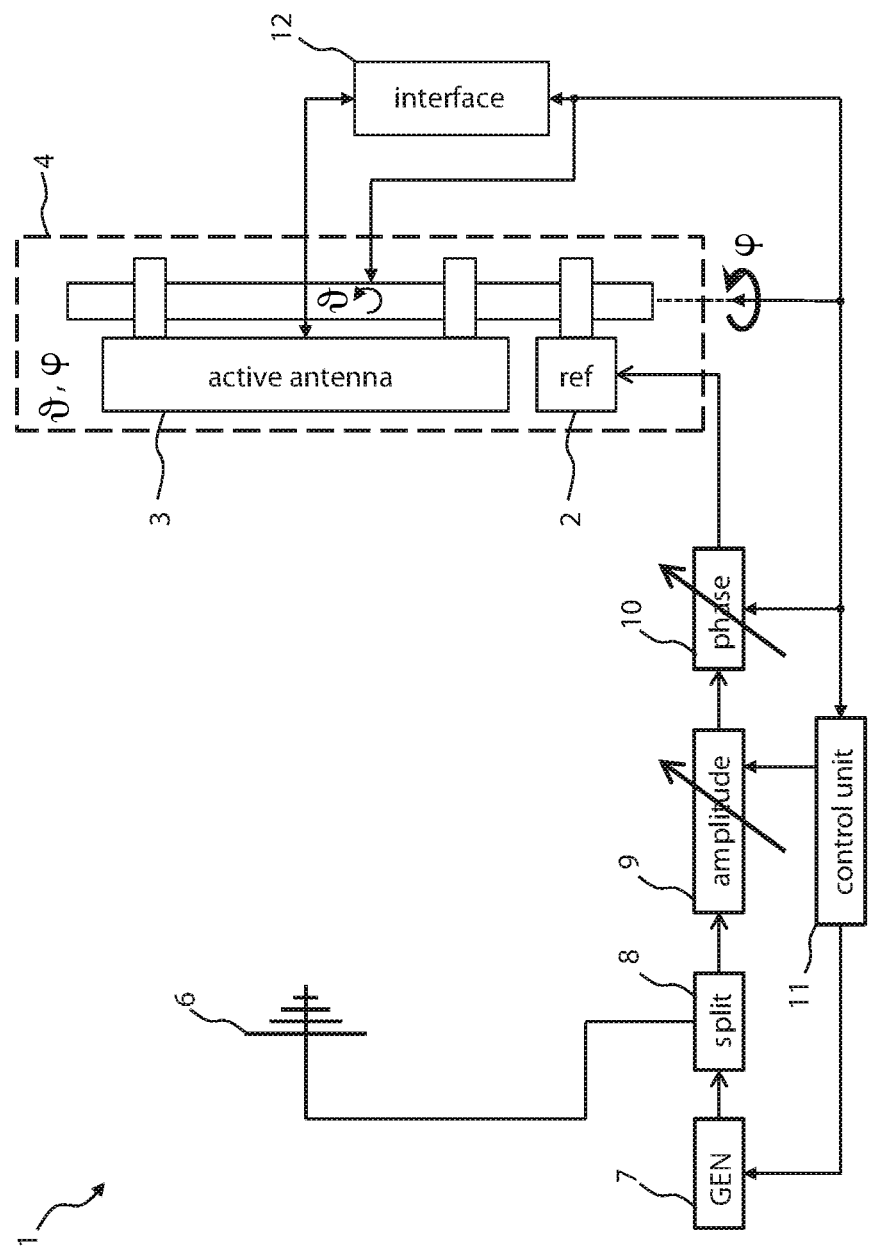
FIG. 2B: a further simplified representation of the measuring device which clarifies the interaction of different components, such as for example the signal generator, the at least one transmitting antenna, the phase controller and the control unit together with the active antenna and the reference antenna and an interface device.
Figure 2C:
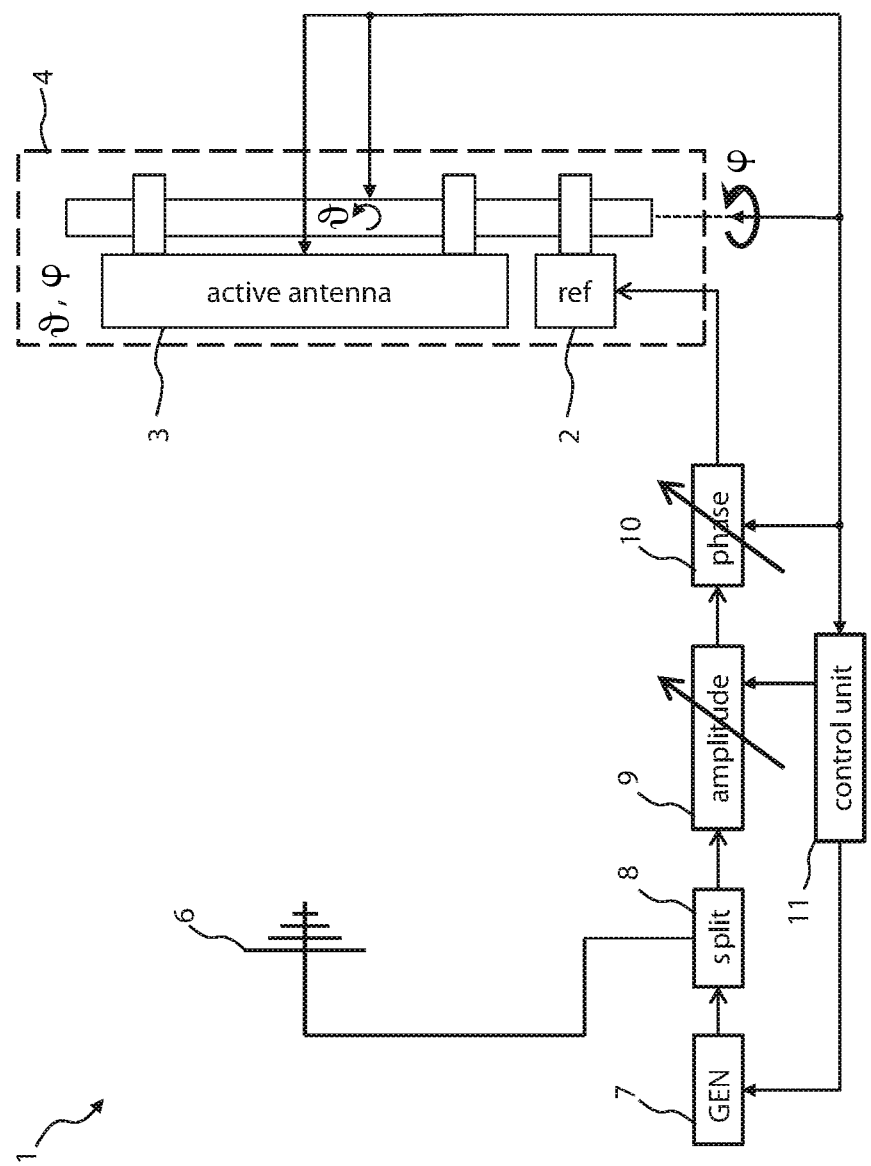
FIG. 2C: a diagram of FIG. 2B omitting interface 12.

FIG. 2B shows, in contrast to FIG. 2A, an interface device 12 which is connected between the active antenna 3 and the control unit 11. The interface device 12 can for example connect the control unit 11 to the proprietary outputs of the active antenna 3. The interface device 12 can also be integrated directly into the control unit 11. FIG. 2C is the same as FIG. 2B with interface 12 omitted.

By means of the interface device 12 it is possible for example to configure the receiver of the active antenna 3 with regard to the start of the software and the setting of the suitable frequency band. A determination of the required power measurement values, wherein indirect measured values, such as for example data throughput measurements, which are a mirror image of the received power are also conceivable, can likewise be set by means of the interface device 12.

The interface device 12 must be tailored accurately to the manufacturer of the active antenna 3 to be examined. Such an interface device 12 which can communicate with the active antenna 3 can usually be obtained from the manufacturer. This interface device can usually pass on measured values which directly represent the measured reception power or from which a conclusion can be drawn indirectly about the reception power.

Figure 3:
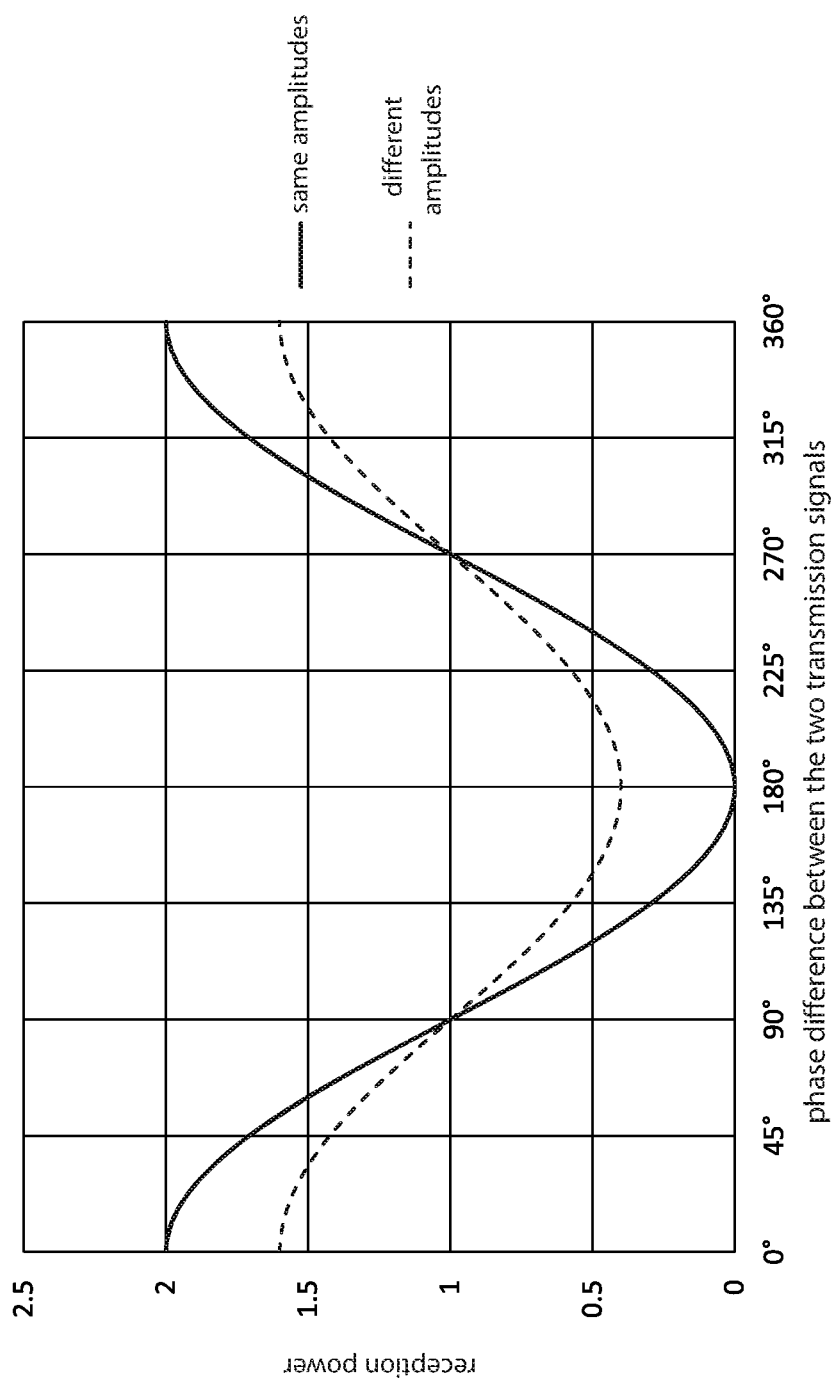
FIG. 3: a representation which clarifies the superimposed transmission signals received by the active antenna, wherein the superimposed transmission signals have the same amplitude in one case and do not in another case.

FIG. 3 shows a representation which clarifies the superimposition of the transmission signals, wherein the superimposed transmission signals have the same amplitude in one case and do not in another case. It shows the phase difference between the two received transmission signals on the abscissa and the received power through the active antenna 3 on the ordinate. Two superimposed transmission signals which have the same amplitudes at the position of the active antenna 3 are shown by solid lines. It can be seen that with a phase difference of 180° between the two transmission signals at the position of the active antenna 3 both transmission signals cancel each other out and the active antenna 3 does not receive any power. On the other hand, with a phase shift of 0° the two transmission signals are added together and the active antenna 3 measures the doubled power. It is problematic if the two transmission signals have substantially different amplitudes at the position of the active antenna 3. The broken line in FIG. 3 shows the situation where the two power levels differ by the factor 9. In this case even with a phase difference of 180° a significant power level is still received by the active antenna 3. In the case in which the two transmission signals have substantially different amplitudes at the position of the active antenna 3 the accuracy in the calculation of the phase difference can diminish. In this case the control unit 11 should always attempt to control the amplitude controller 9 in such a way that the transmission signal of the transmitting antenna 6 and the transmission signal of the reference antenna 2 at the position of the active antenna 3 has, as far as possible, approximately the same amplitude.

Figure 4:
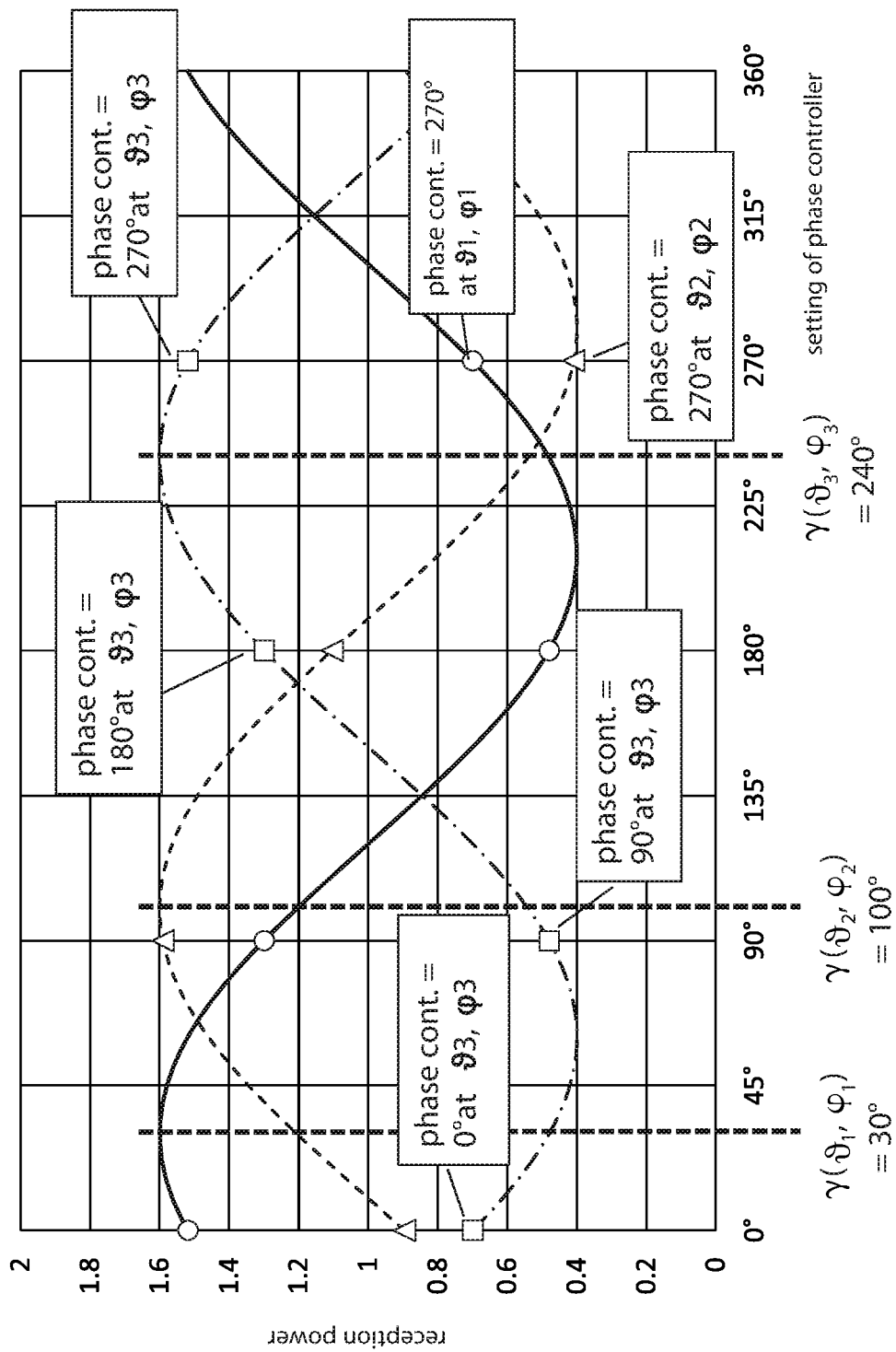
FIG. 4: a representation which shows different simulated superimposed transmission signals and clarifies how the phase difference is determined for each simulated transmission signal.

FIG. 4 shows a representation which shows different superimposed transmission signals as a function of the setting of the phase controller and clarifies how the phase difference is determined for each superimposed transmission signal. FIG. 4 shows three superimposed transmission signals and how they can be measured at the location of the active antenna 3. The first superimposed transmission signal was captured as the active antenna 3 with the solid angle θ1 and ϕ1 was oriented. This superimposed transmission signal is illustrated by a solid line. A further superimposed transmission signal was captured at the solid angle θ2 and ϕ2. This superimposed transmission signal is illustrated by a solid line. A third superimposed transmission signal was captured at a solid angle $\theta_3$ and $\phi_3$. This third superimposed transmission signal is illustrated by a dash-dot line.

In order to be able to determine the required phase difference γ for each of these solid angles, four power values were measured in each case. A first power value was measured as the phase controller 10 as no additional phase shift has been set between the signal at its input and at its output. A second power value was measured for each of these superimposed transmission signals, as the phase controller 10 has set a phase shift of additionally 90°. A third power value was determined, as the phase controller 10 has set a phase offset of additionally 180°. A fourth and last power value was determined for each of these superimposed transmission signals, as the phase controller 10 has set an additional phase shift of 270°. These measured values are highlighted by circles, triangles or squares within FIG. 4. The required phase values γ are calculated with reference to these measured values and the fact that the required transmission signal has a cosinusoidal pattern. Due to slight measurement inaccuracies an advantageous mathematical calculation method consists of approximating a cosinusoidal signal to the measured power values in such a way that it has the least possible spacing from all points. This is achieved for example by the mathematical "least squares" method.

It will be recognized that the first superimposed transmission signal with the solid angle θ1 and ϕ1 has a phase offset of 30° with respect to the cosine function. It may be concluded from this that the transmission signal from the transmitting antenna 6 received by the active antenna 3 is shifted by 30° with respect to the received transmission signal from the reference antenna 2 and that is precisely the required phase shift at the solid angle θ1 and ϕ1. However, the signal transmitted by the reference antenna 2 should not change relative to the signal transmitted by the transmitting antenna 6, but must be the same for all set phase values, which means that the solid angle should not be changed during the measurement steps and also the relative phase relationship of the two RF signals which are sent to the transmitting antenna 6 and to the reference antenna 2 must correspond precisely to the set phase offset.

The second superimposed transmission signal with the solid angle θ2 and ϕ2 has a phase offset of 100°. The third superimposed transmission signal with the solid angle θ3 and ϕ3 has a phase offset of 240°.

After a phase offset has been determined, the control unit 11 controls the rotating unit 4 in such a way that a further solid angle θ, ϕ is set. Then for this angle the magnitude and the phase offset are likewise determined. These values are then used for the near field/far field transformation.

Figure 5A:
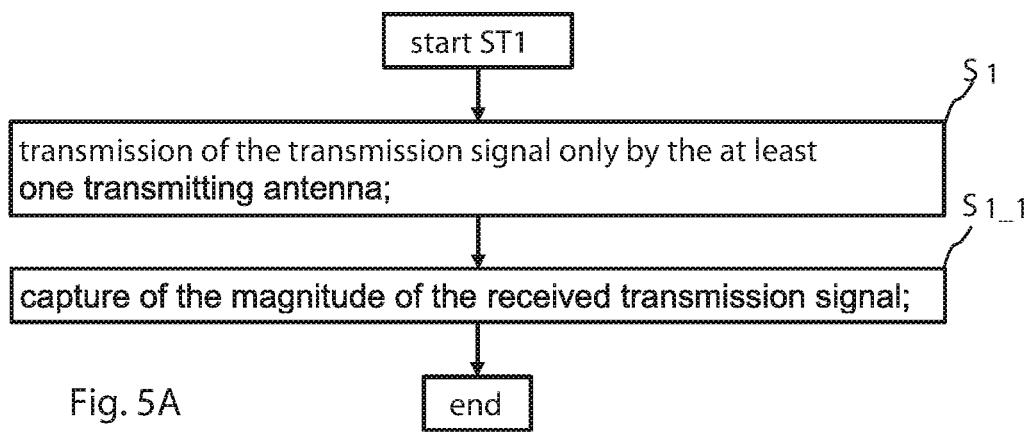
FIG. 5A-5C: a plurality of flow diagrams which explain the method steps ST1, ST2 and ST3 in greater detail.
Figure 5B:
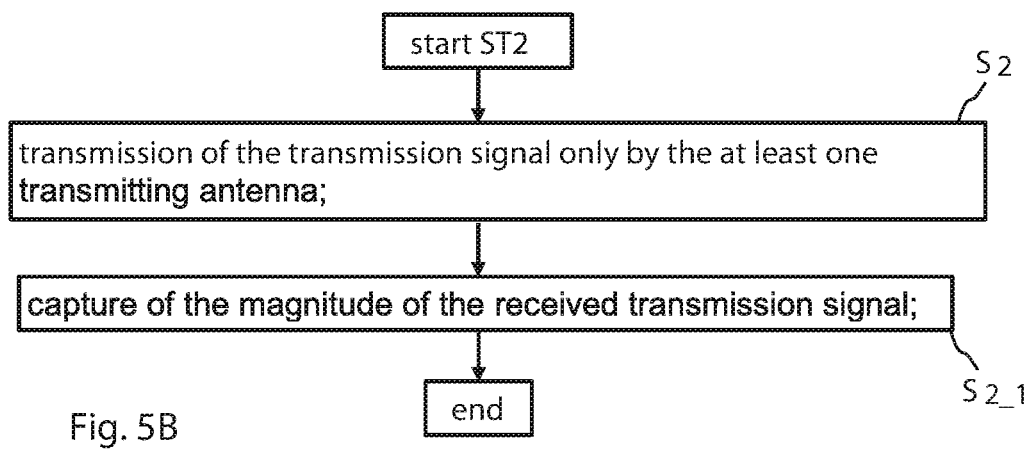
Figure 5C:
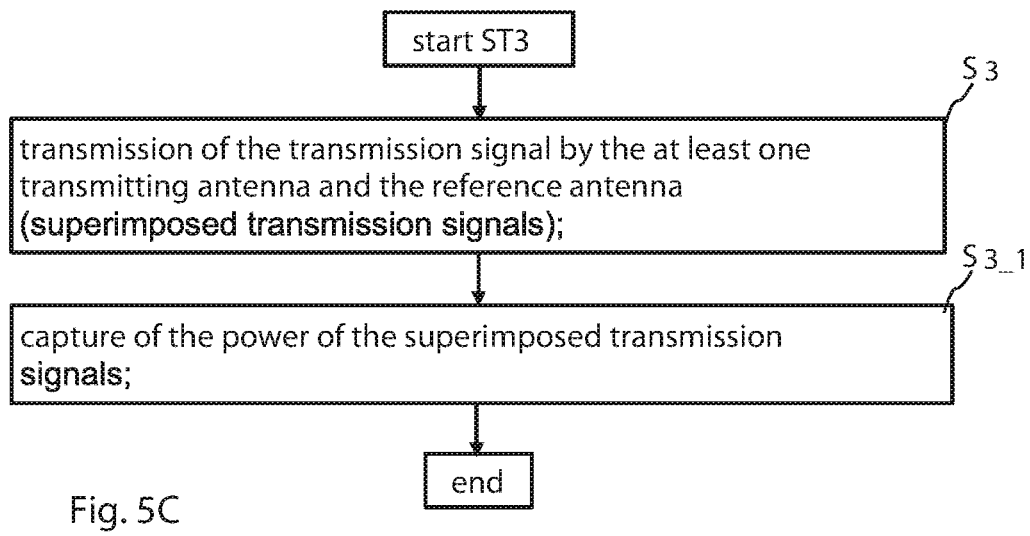

FIG. 5 shows a plurality of flow diagrams which explain the method steps ST1, ST2 and ST3 in greater detail. These method steps ST1, ST2 and ST3 are the cornerstones of determining the required magnitude and the required phase for the active antenna 3. In this case different combinations of these method steps ST1, ST2 and ST3 are possible, which are also than designated as a sequence. Within the method step ST1 only a transmission $S_1$ of the transmission signal by the transmitting antenna 6 and capture $S_{1\_1}$ of a power value of the transmission signal received by the active antenna 3 takes place. Within the method step ST2 only a transmission $S_2$ of the transmission signal by the reference antenna 2 and capture $S_{2\_1}$ of a power value of the transmission signal received by the active antenna 3 takes place. On the other hand within the method step ST3 simultaneous transmission of the transmission signal by means of the transmitting antenna 6 and the reference antenna takes place while generating superimposed transmission signals and capture $S_{3\_1}$ of a power value of the superimposed transmission signals received by the active antenna 3.

In this case it is important that a sequence of these three method steps ST1, ST2 and, ST3 is carried out in any order and in any combination, with at least one method step ST1, ST2, ST3 being carried out multiple times, wherein the sequence of the at least three method steps ST1, ST2, ST3 always comprises the method step ST3 at least once. The method step ST1 and ST2 do not absolutely have to be implemented in a sequence.

Figure 6A:
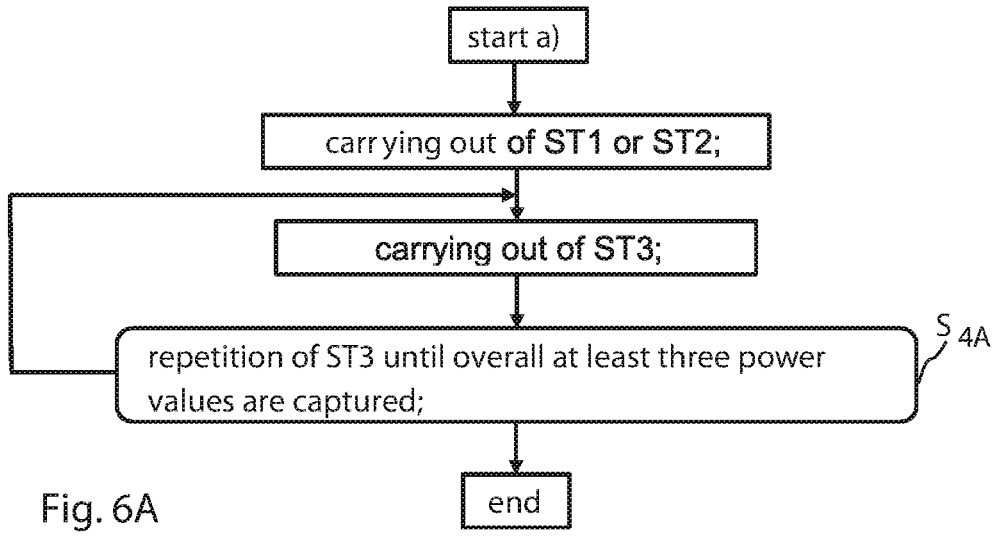
FIG. 6A: a flow diagram for determination of the power values of a signal received by the active antenna according to the sequence a)

FIG. 6A shows a flow diagram for determination of the power values of a signal received by the active antenna according to the sequence a). This means that either the method step ST1 or the method step ST2 is carried out once. The method step ST3 is carried out before this or after this. After the method step ST3 has been carried out the method step $S_{4.4}$ is carried out. Within the method step $S_{4.4}$ the method step ST3 is repeated as often as required until at least three power values are obtained. For this purpose the method step ST3 must be carried out at least twice.

Figure 6B:
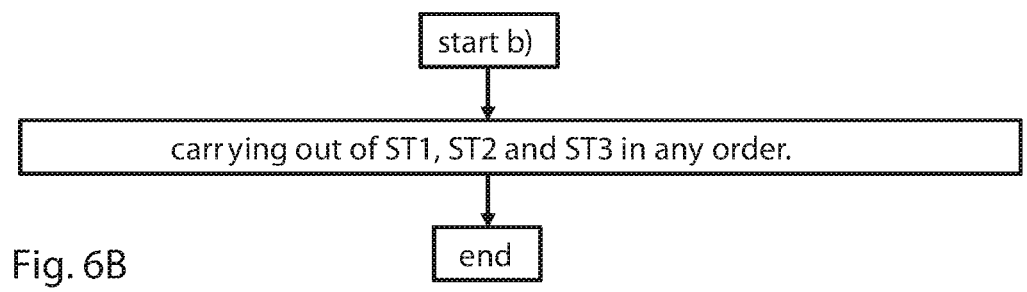
FIG. 6B: a further flow diagram for determination of the power values of a signal received by the active antenna according to the sequence b)

FIG. 6B shows a flow diagram for determination of the power values of a signal received by the active antenna according to the sequence b). The method steps ST1, ST2 and ST3 are carried out at least once in any order.

Figure 6C:
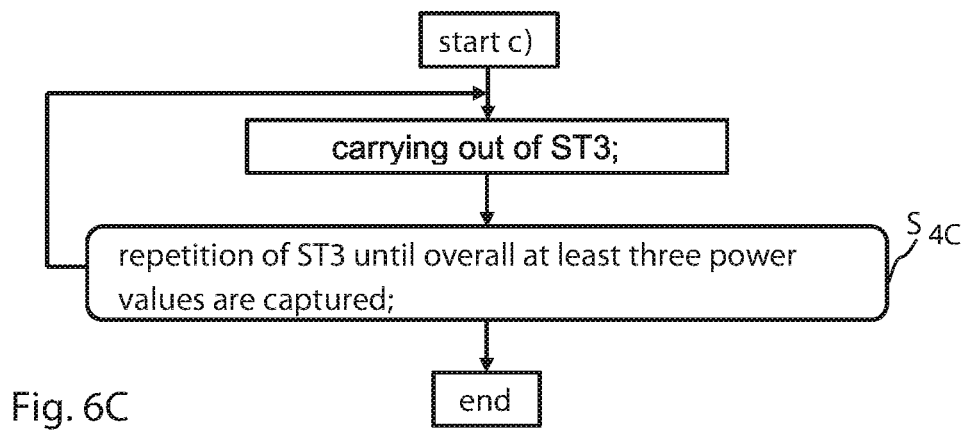
FIG. 6C: a further flow diagram for determination of the power values of a signal received by the active antenna according to the sequence c)

FIG. 6C shows a flow diagram for determination of the power values of a signal received by the active antenna according to the sequence c). Only the method step ST3 is carried out. After the method step ST3 has been carried out the method step $S_{4C}$ is carried out. Within the method step $S_{4C}$ the method step ST3 is repeated as often as required until at least three power values are obtained. For this purpose the method step ST3 must be carried out at least three times.

Figure 7A:
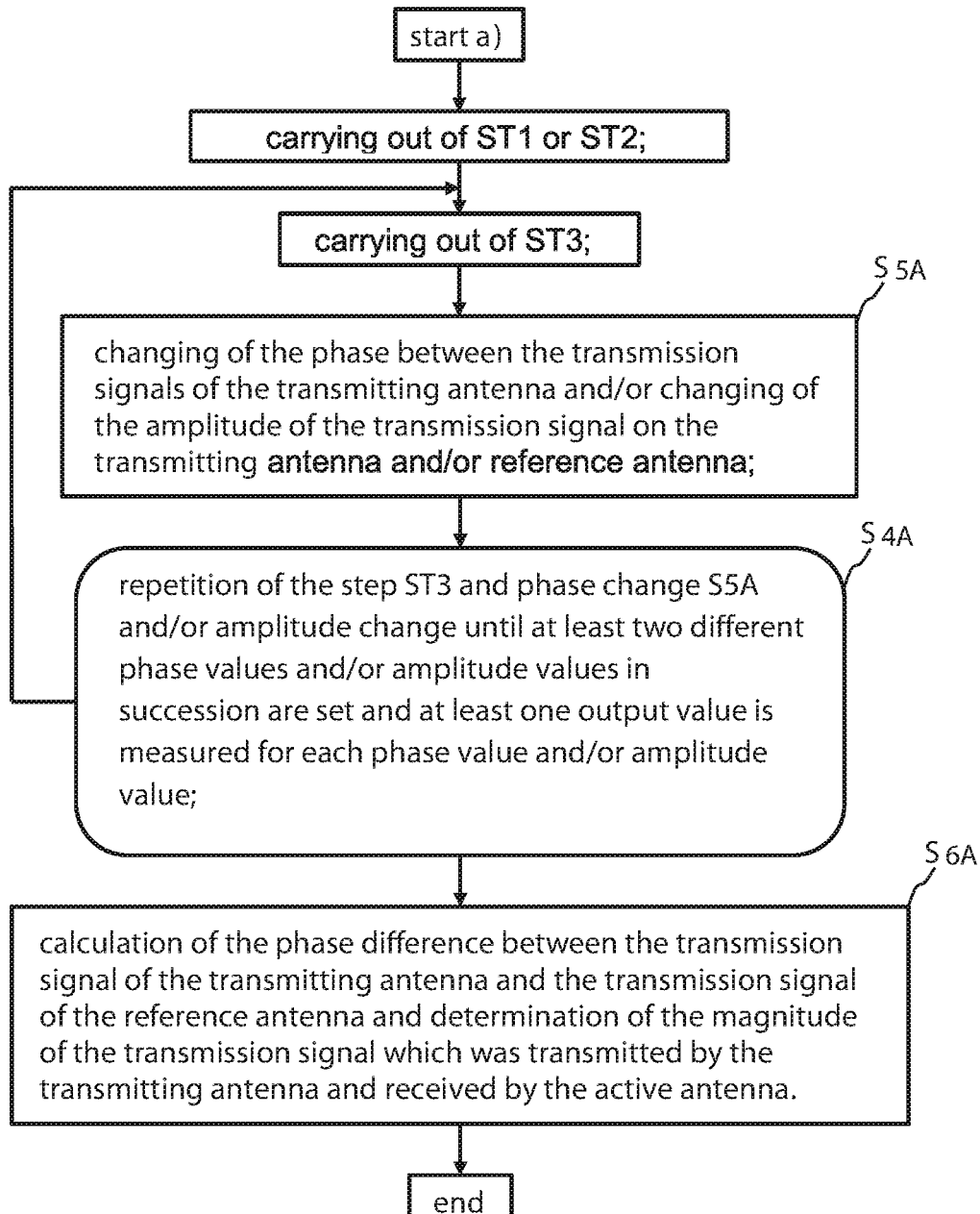
FIG. 7A: a further flow diagram for determination of the power values and the magnitude and the phase of a signal received by the active antenna according to the sequence a)

FIG. 7A shows a flow diagram for determination of the power values for calculation of the magnitude and phase of a transmission signal received by the active antenna by means of the sequence a). In a first method step $S_1$ or $S_2$ a transmission signal is transmitted only by the transmitting antenna 6 or only by the reference antenna 2. The transmission signal may for example be a sinusoidal or cosinusoidal signal.

In a further method step $S_{1\_1}$ or $S_{2\_1}$ the signal transmitted by the transmitting antenna 6 or reference antenna 2 is captured by the active antenna 3. These method steps $S_1$ and $S_{1\_1}$ or $S_2$ and $S_{2\_1}$ are illustrated by the method step ST1 or ST2. The active antenna 3 transmits the power value and thus the magnitude of the received transmission signals to the control unit 11. The power value is captured directly or indirectly. In the case of indirect capture of the power it is possible for example to capture the data throughput which in turn correlates with the received power, so that the power can be calculated therefrom.

In the method step $S_3$ both the transmitting antenna 6 and also the reference antenna 2 simultaneously transmit a transmission signal which is present as a superimposed transmission signal at the position of the active antenna 3.

Within the method step $S_3$, the power of the superimposed transmission signals is captured by the active antenna 3 and is output to the control unit 11.

These two method steps $S_3$ and $S_{3\_1}$ are part of the method step ST3.

In the further method step $S_{5A}$ the phase controller 10 carries out a change of phase between the transmission signal of the transmitting antenna 6 and the transmission signal of the reference antenna 2. Alternatively or additionally it is also possible for the amplitude controller 9 to carry out an amplitude change of the transmission signal on the transmitting antenna 6 and/or of the transmission signal on the reference antenna 2.

The method step $S_{4A}$ is carried out after this. Within the method step $S_{4A}$ the previous method steps ST3 and the phase change $S_{5A}$ and/or amplitude change are carried out successively as often as required until at least one power value in each case is captured for at least two different phase values between the transmission signal on the transmitting antenna 6 and the transmission signal on the reference antenna 2 and/or for at least two different amplitude values of the transmission signal on the transmitting antenna 6 and/or of the transmission signal on the reference antenna 2. This means that the phase controller 10 has to carry out a phase change between the signal at its input and the signal at its output at least once, so that overall at least two signals which have a different phase are output. The same applies likewise to the amplitude controller 9. However, the method step $S_{4A}$ is preferably carried out as often as required until at least one power value in each case is measured for at least three, preferably four or more different phase values and/or amplitude values.

The method step $S_{6A}$ is carried out after this. Within the method step S6A the required phase difference between the transmission signal of the transmitting antenna 6 and the transmission signal of the reference antenna 2 is calculated with reference to the measured at least three power values, wherein the two transmission signals are received by the active antenna 3. In this case a first output value was determined in the method step ST1 or ST2. The two further power values were determined in the method step ST3, which was carried out at least twice for different phase settings.

This situation is for example very clearly illustrated in FIG. 4 and in mathematical relations set out above. If only the method step ST1 has been carried out and therefore the transmitting antenna 6 has transmitted the signal, this output value corresponds to the required magnitude. If instead of this the method step ST2 has been carried out and therefore the reference antenna 2 has transmitted the signal, then the required magnitude can be calculated from the at least three described power values.

Naturally the method step ST3 can also be started. The method steps ST1 or ST2 can also be carried out for example after the method step S4A. This means that all steps which contain the measurement of a transmission signal can be interchanged when they are carried out. This applies to the transmission of a transmission signal or a plurality of transmission signals and the simultaneous measurement of the power of this or these transmission signals. The concluding calculation of the phase or of the magnitude, if for example only the reference antenna 2 transmits, takes place finally, that is to say after the transmission signals have been transmitted and the power values have been measured for a solid angle $\theta$, $\phi$. This applies for all sequences a), b) and c).

Figure 7B:
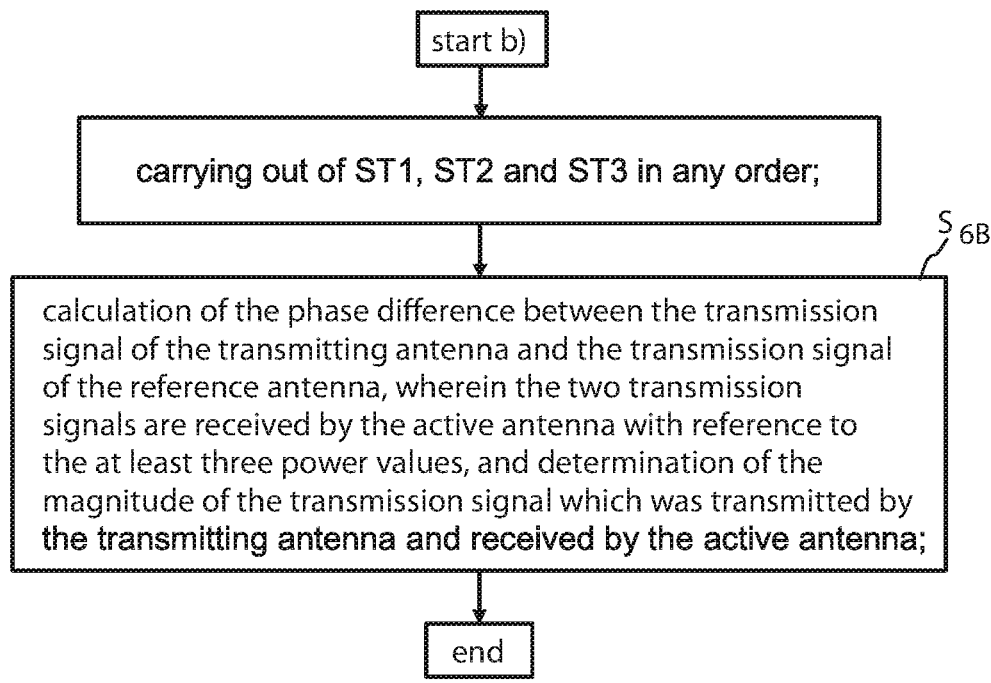
FIG. 7B: a further flow diagram for determination of the power values and the magnitude and the phase of a signal received by the active antenna according to the sequence b)

FIG. 7B shows a further flow diagram for determination of power values for calculation of the magnitude and phase of a transmission signal received by the active antenna 3 by means of the sequence b). In a first method step $S_1$ a transmission signal is transmitted only by the transmitting antenna 6.

In a further method step $S_{1\_1}$ the magnitude of the transmission signal received by the active antenna 3 is captured.

These two method steps $S_1$ and $S_{1\_1}$ constitute part of the method step ST1.

In the method step $S_2$ the transmission signal is transmitted only by the reference antenna 2.

Furthermore the method step $S_{2\_1}$ is carried out and again the magnitude of the transmission signal received by the active antenna 3 is captured.

These two method steps $S_2$ and $S_{2\_1}$ are part of the method step ST2.

In the method step S3 a transmission signal is transmitted simultaneously by the transmitting antenna 6 and by the reference antenna 2, which leads to a superimposed transmission signal.

In the method step $S_{3\_1}$ the power of the superimposed transmission signal received by the active antenna 3 is captured.

These two method steps $S_3$ and $S_{3\_1}$ are part of the method step ST3.

Following this, in the method step $S_{6B}$ a phase difference is calculated on the active antenna 3 between the transmission signal which was transmitted by the transmitting antenna 6 and the transmission signal which was transmitted by the reference antenna 2. The magnitude is determined with reference to the power value from the method step ST1.

Of course the order of the method steps ST1, ST2 and ST3 can be interchanged in any way. A phase controller 10 is not required here, although it can nevertheless be used for improvement of the accuracy. The same applies to the use of an amplitude controller 9.

Figure 7C:
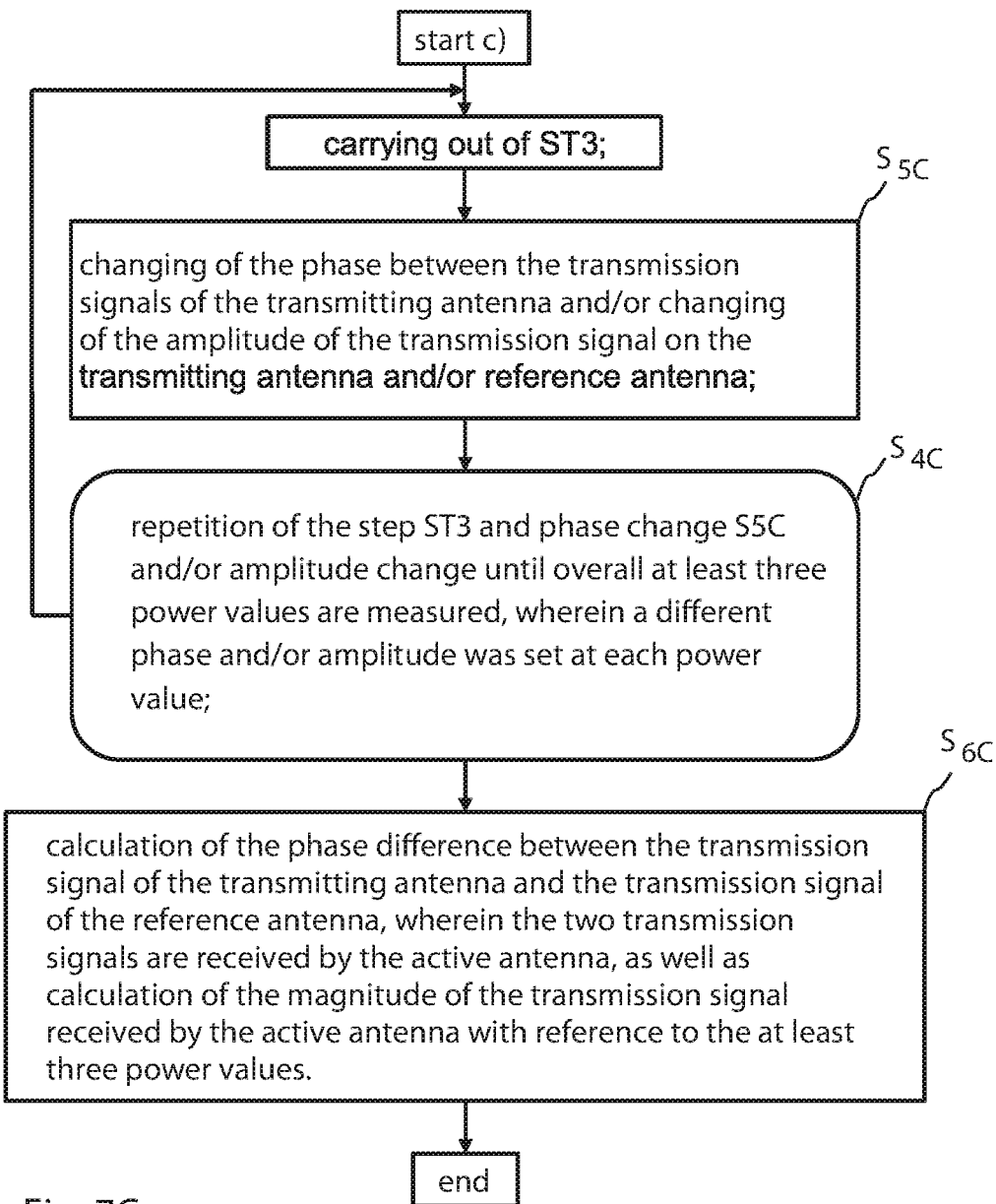
FIG. 7C: a further flow diagram for determination of the power values and the magnitude and the phase of a signal received by the active antenna according to the sequence c)

FIG. 7C shows a further flow diagram for determination of power values for calculation of the magnitude and phase of a transmission signal received by the active antenna 3 by means of the sequence c). In a first method step $S_3$ a transmission signal is transmitted simultaneously by the transmitting antenna 6 and the reference antenna 2.

In a further method step $S_{3\_1}$ the power of the superimposed transmission signal received by the active antenna 3 is captured.

These two method steps $S_3$ and $S_{3\_1}$ are part of the method step ST3.

In the further method step $S_{5C}$ the phase controller 10 carries out a change of phase between the transmission signal of the transmitting antenna 6 and the transmission signal of the reference antenna 2. Alternatively or additionally it is also possible for the amplitude controller 9 to carry out an amplitude change of the transmission signal on the transmitting antenna 6 and/or of the transmission signal on the reference antenna 2.

The method step $S_{4C}$ is carried out after this. Within the method step $S_{4C}$ the previous method steps ST3 and the phase change $S_{5C}$ and/or amplitude change are carried out as often as required until at least one power value in each case is captured for at least three different phase values between the transmission signal on the transmitting antenna 6 and the transmission signal on the reference antenna 2 and/or for at least three different amplitude values of the transmission signal on the transmitting antenna 6 and/or of the transmission signal on the reference antenna 2. This means that the phase controller 10 has to carry out a phase change between the signal at its input and the signal at its output at least twice, so that overall at least three signals which have a different phase are output. The same applies likewise to the amplitude controller. However, the method step $S_{4C}$ is preferably carried out as often as required until at least one power value in each case is measured for at least four or more different phase values and/or amplitude values.

The method step $S_{6C}$ is carried out after this. Within the method step $S_{6C}$ the required phase difference between the transmission signal of the transmitting antenna 6 and the transmission signal of the reference antenna 2 is calculated with reference to the measured at least three power values, wherein the two transmission signals are received by the active antenna 3. The same also applies to the calculation of the magnitude of the transmission signal which was transmitted by the transmitting antenna 6.

However, the accuracy of the method according to FIGS. 7B and 7C is not as high as that of the method according to FIG. 7A. Therefore in this method a further measurement can be additionally carried out, wherein only the transmitting antenna 6 or only the reference antenna 2 or both antennas 2, 6 together transmit a transmission signal with a changed phase setting. Furthermore it may be practical if the transmission power is changed by the amplitude controller 9 between the individual measurements, so that the magnitude and the phase for a solid angle θ, φ in the event of different transmission power for the transmitting antenna 6 and/or the reference antenna 2 takes place, wherein the magnitude of the change in the transmission power must be known.

The accuracy can also be increased in that values for magnitude and phase which have been determined for different solid angles θ, φ are, compared with one another. This is achieved by utilizing the constancy of the calculated values for magnitude and phase in the event of only small changes to the solid angles θ, φ.

In the case where the amplitude and the phase for a solid angle θ, φ according to one of the sequences a), b) or c) has been measured, it is also sufficient if for the other solid angles θ, φ only two measurements are carried out with a superimposed transmission signal, that is to say if for each new solid angle only the transmitting antenna 6 and the reference antenna 2 together transmit a transmission signal, wherein the phase controller 10 only has to change the phase once. Due to the complete measurement of the first solid angle θ, φ the value for the power which is coupled in directly from the reference antenna 2 into the active antenna 3 is known. There is no change to this power and also the orientation of the reference antenna 2 with respect to the active antenna 3 does not change. As an alternative it is likewise possible, if in the measurements for the further solid angles θ, φ for each further solid angle θ, φ only the transmitting antenna 6 transmits the transmission signal and once the transmitting antenna 6 and the reference antenna 2 together transmit a transmission signal. However, the measurement is more inaccurate here, although the measurement time is shortened.

Figure 8:
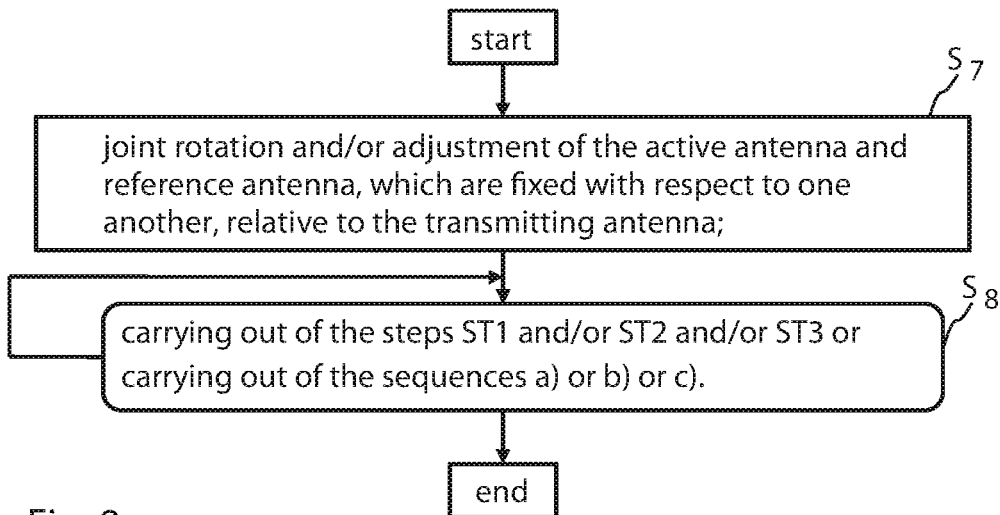
FIG. 8: a further flow diagram which explains the change to the azimuth angle and the angle of elevation in order to capture the magnitude and the phase of a signal received by the active antenna for different solid angles.

FIG. 8 shows a further flow diagram which explains the change to the azimuth angle φ and the angle of elevation θ in order to be able to capture the magnitude and the phase of a signal received by the active antenna for a plurality of solid angles. Since both the magnitude and also the phase have been calculated for a solid angle θ, φ the method step S7 is carried out. Within the method step S7 the control unit 11 controls the rotating unit 4 in such a way that the reference antenna 2 and the active antenna 3 which form a unit are rotated and/or adjusted together by said rotating unit relative to the transmitting antenna 6 which is stationary, that is to say immovable. In this case the rotating unit 4 can change both the azimuth angle φ and also the angle of elevation θ. The method step $S_8$ is carried out after a new solid angle has been set. Within the method step $S_8$ the previous method steps ST1 and/or ST2 and/or ST3 or one the sequences a) or b) or c) are carried out again.

Figure 9:
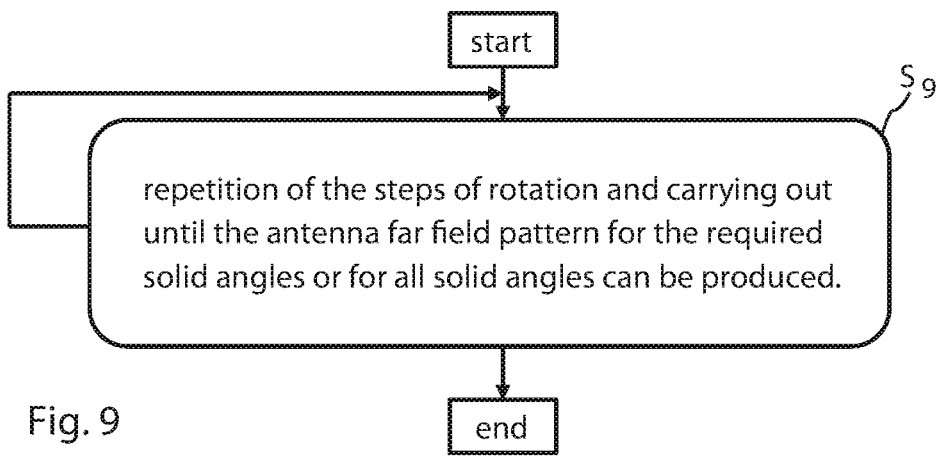
FIG. 9: a further flow diagram which explains how the magnitudes and phases are determined for all solid angles in order to be able to determine the antenna far field pattern.

FIG. 9 shows a further flow diagram which explains how the further magnitudes and phases are determined which are necessary for calculation of the antenna far field pattern. Within the method step $S_9$ the method steps $S_7$ and $S_8$ are carried out as often as required until the values for magnitude and phase for the required solid angles θ, φ or for all solid angles θ, φ have been determined. Then the near field/far field transformation can be carried out for a part of the solid angle of the active antenna 3 or for the entire solid angle of the active antenna 3. The required solid angles θ, φ may be for example those in which the active antenna 3 emits particularly well, that is to say for example these in which the main lobe is located. More preferably the antenna far field pattern can also be calculated for the solid angles θ, φ in which the side lobes with the highest intensity are formed.

Figure 10:
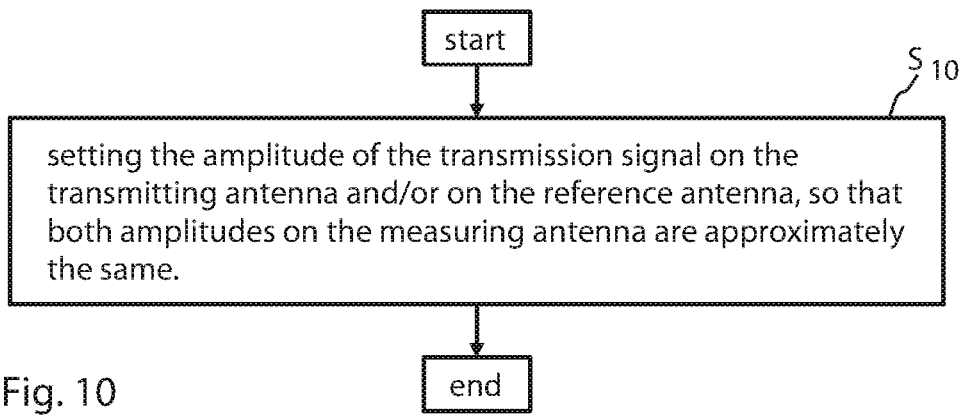
FIG. 10: a further flow diagram which describes the adaptation of the amplitude of the transmission signal of the at least one transmitting antenna to the amplitude of the transmission signal of the reference antenna.

FIG. 10 shows a further flow diagram which describes the adaptation of the amplitude of the transmission signal of the at least one transmitting antenna 6 to the amplitude of the transmission signal of the reference antenna 2 or vice versa. For this purpose the method step $S_{10}$ is carried out. Within the method step $S_{10}$ the control unit 11 controls an amplitude controller 9 in such a way that a signal which is delivered to the input of the amplitude controller 9 is transmitted at the output thereof with its amplitude either amplified or attenuated. The amplitude controller 9 can be introduced both in the signal path between the second output of the power splitter 8 and the reference antenna 2 and also in the second signal path between the first output of the power splitter 8 and the transmitting antenna 6. In this case the objective is that the amplitude of the transmission signal which is transmitted by the transmitting antenna 6 and the amplitude of the transmission signal which is transmitted by the reference antenna 2 at the location of the active antenna 3 are at approximately the same level.

Therefore within the method step $S_{10}$, preferably alternately, a signal is transmitted only by the transmitting antenna 6 and the power thereof is captured by the active antenna 3. Subsequently a signal is transmitted only by the reference antenna 2 and once again the power thereof is captured by the active antenna 3. Subsequently to this the magnitude of the amplitude of the transmission signal which is transmitted by the transmitting antenna 6 and/or which is transmitted by the reference antenna 2 is increased and/or lowered, so that both transmission signals which are superimposed at the location of the active antenna 3 are. The expression "at approximately the same level" is understood to mean a deviation in which the two power levels differ by less than the factor 20, preferably by less than the factor ten, more preferably by less than the factor five, more preferably by less than the factor two, more preferably by less than the factor 1.2.

The method step $S_{10}$ can be carried out for example once before the method step ST1 or ST2 or ST3 is carried out. However, the method step $S_{10}$ can also be carried out after each rotation and/or adjustment of the reference antenna 2 and active antenna 3 which form a unit, that is to say after the method step $S_7$.

The expression "unit," which is formed by the active antenna 3 and the reference antenna 2, should be understood to mean that during the measuring operation of the magnitude and the phase for the solid angle $\theta$, $\phi$ the reference antenna 2 cannot be displaced and/or rotated relative to the active antenna 3, both antennas 2, 3 being stationary relative to one another, that is to say they are mechanically fixed to one another. The expression "unit" should not be interpreted to mean that both antennas must also be electrically connected to one another and must act with one another.

Whenever reference is made to the capture of a power value, this preferably involves the capture of an averaged power value. This means that a plurality of, preferably more than 100, more preferably more than 1000 power values for a measurement setting, that is to say in a method step ST1, ST2 or ST3, are measured in a very short time and that an averaged power value is calculated from these power values. It may also be that the active antenna 3 already outputs an averaged power. In this case a transmitted value is sufficient therefor. A measurement setting is understood to mean that within a measurement setting the solid angle $\theta$, $\phi$ or the amplitude or the phase are unchanged and that in the case of the antennas 2, 6 which transmit the transmission signal there is no change their position or orientation.

A possibility for likewise describing the method is achieved by:

Method for determining the magnitude and phase from the power values of a signal received by the active antenna 3, comprising the following method steps:

use of a transmitting antenna 6 and a reference antenna 2, wherein the reference antenna 2 is disposed at a predetermined position and a predetermined spacing relative to the active antenna 3;

use of a signal generator 7 for production of a transmission signal, wherein the signal generator 7 is connected to the transmitting antenna 6 and to the reference antenna 2;

wherein the following further method steps are carried out in any order:

only transmission $S_1$ of the transmission signal by the transmitting antenna 6 and capture $S_{1\_1}$ of a power value of the transmission signal received by the active antenna 3; and/or only transmission $S_2$ of the transmission signal by the reference antenna 2 and capture $S_{2\_1}$ of a power value of the transmission signal received by the active antenna 3; and/or simultaneous transmission $S_3$ of the transmission signal by means of the transmitting antenna 6 and the reference antenna 2 while generating superimposed transmission signals, and capture $S_{3\_1}$ of a power value of the superimposed transmission signals received by the active antenna 3;

Repeating $S_{4A}$, $S_{4C}$ of the method steps of only transmission S1 by the transmitting antenna 6 and capture $S_{1\_1}$ and/or only transmission $S_2$ by the reference antenna 2 and capture $S_{2\_1}$ and/or simultaneous transmission $S_3$ and capture $S_{3\_1}$, if overall less than three power values are captured, provided that a total of at least three power values are captured, wherein the method step of simultaneous transmission $S_3$ and capture $S_{3\_1}$ is carried out at least once;

wherein finally the following method step is carried out:

Calculation $S_{6A}$, $S_{6B}$, $S_{6C}$ of the phase difference on the active antenna 3 between the transmission signal which was transmitted by the transmitting antenna 6 and the transmission signal which was transmitted by the reference antenna 2 with reference to the at least three power values, as well as determination of the magnitude of the transmitting signal which was transmitted by the transmitting antenna and received by the active antenna 3.

Within the further method and within the previous method, for determining the at least three power values the method steps of only transmission $S_1$ by the transmitting antenna 6 and capture $S_{1\_1}$ and only transmission $S_2$ by the reference antenna 2 and capture $S_{2\_1}$ are preferably carried out at most once. This means that also in the sequences a) or b) or c) the method steps ST1 and ST2 are preferably carried out only once. More preferably these method steps ST1 and ST2 are carried twice or several times if an amplitude controller 9 has increased or decreased its amplitude.

Moreover, it is possible in principle that even more than one transmitting antenna 6 is used. An antenna array can also be used. When a plurality of transmitting antennas 6 are used they are preferably disposed stationary relative to one another. The plurality of transmitting antenna 6 can transmit together or in succession. In this case the plurality of transmitting antennas 6 preferably transmit at different frequencies, wherein the reference antenna 2 preferably transmits simultaneously at all these frequencies. The active antenna 3 measures the power at all frequencies preferably simultaneously. The method step ST1 can be carried out for a first transmitting antenna 6 and for each further transmitting antenna 6. The same also applies to the method step ST3. Here too in addition to the reference antenna 2 the plurality of transmitting antennas 6 can transmit the transmission signal simultaneously. It is also possible that the transmitting antenna 6 is preferably moved radially around the reference antenna 2 and the active antenna 3. Also the use of a plurality of reference antennas 2 is possible in principle.

The invention is not limited to the described embodiments. Within the scope of the invention all the features described and/or illustrated can be combined with one another in any way.

The invention claimed is:

1. A method for determining power values of a signal received by an active antenna in order to determine magnitude and a phase, comprising:

using at least one transmitting antenna and a reference antenna, wherein the reference antenna is disposed at a predetermined position and a predetermined spacing relative to the active antenna;

using a signal generator to produce a transmission signal, wherein the signal generator is connected to the at least one transmitting antenna and to the reference antenna; and performing the following sequence in any order and in any combination, including performing at least one of the following multiple times:

ST1: only transmission of the transmission signal by the at least one transmitting antenna and capture of a first power value of the transmission signal received by the active antenna;

ST2: only transmission of the transmission signal by the reference antenna and capture of a second power value of the transmission signal received by the active antenna;

ST3: simultaneous transmission of the transmission signal by the at least one transmitting antenna and the reference antenna while generating superimposed transmission signals and capture of a third power value of the superimposed transmission signals received by the active antenna;

wherein performing the sequence always comprises performing ST3 at least once.

2. The method according to claim 1, wherein, capture of the at least first, second and third power values and determining the magnitude and phase, comprises performing at least one of the following three sequences a) or b) or c) with the same orientation and position of the active antenna and reference antenna in relation to the at least one transmitting antenna:

a):
carrying out ST1 or ST2;
carrying out ST3;
repeating ST3 until overall at least three power values are captured;

or b):
carrying out ST1;
carrying out ST2;
carrying out ST3;

or c):
carrying out ST3;
repeating ST3 until overall at least three power values are captured.

3. The method according to claim 2, wherein the sequences a) or b) or c) comprise:

a):
using a phase controller and/or an amplitude controller which is connected between the signal generator and the at least one transmitting antenna and/or between the signal generator and the reference antenna;

carrying out ST1 or ST2;
carrying out ST3;
carrying out of a phase change between the transmission signal on the at least one transmitting antenna and the transmission signal on the reference antenna and/or carrying out an amplitude change of the transmission signal on the at least one transmitting antenna and/or of the transmission signal on the reference antenna:

repeating the previous ST3 and the phase change and/or amplitude change until at least one power value in each case is captured for at least two different phase values between the transmission signal on the at least one transmitting antenna and the transmission signal on the reference antenna and/or for at least two different amplitude values of the transmission signal on the at least one transmitting antenna and/or of the transmission signal on the reference antenna;

calculating the phase difference on the active antenna between the transmission signal which was transmitted by the at least one transmitting antenna and the transmission signal which was transmitted by the reference antenna with reference to the first, second and third power values, as well determining magnitude of the transmission signal which was transmitted by the at least one transmitting antenna and received by the active antenna, by:

i) the measured result, that is to say the power value from ST1 if this has been carried out and the at least one transmitting antenna alone has transmitted the transmission signal; or ii) the first, second and third power values, if ST2 has been carried out and the reference antenna alone has transmitted the transmission signal;

or b):
carrying out ST1;
carrying out ST2;
carrying out ST3;
calculating the phase difference on the active antenna between the transmission signal which was transmitted by the at least one transmitting antenna and the transmission signal which was transmitted by the reference antenna with reference to the at least first, second and third power values, and determining the magnitude of the transmission signal which was transmitted by the at least one transmitting antenna and received by the active antenna with the power value from ST1 as only the at least one transmitting antenna has transmitted the transmission signal, or c):
using a phase controller and/or an amplitude controller which is connected between the signal generator and the at least one transmitting antenna and/or between the signal generator and the reference antenna; and/or carrying out of an amplitude change of the transmission signal on the at least one transmitting antenna and/or of the transmission signal on the reference antenna;

carrying out ST3;
carrying out a phase change between the transmission signal on the at least one transmitting antenna and the transmission signal on the reference antenna and/or carrying out of an amplitude change of the transmission signal on the at least one transmitting antenna and/or of the transmission signal on the reference antenna:

repeating the previous ST3 and phase change and/or amplitude change until at least one power value in each case is captured for at least three different phase values between the transmission signal on the at least one transmitting antenna and the transmission signal on the reference antenna and/or for at least three different amplitude values of the transmission signal on the at least one transmitting antenna and/or of the transmission signal on the reference antenna;

calculating the phase difference on the active antenna between the transmission signal which was transmitted by the at least one transmitting antenna and the transmission signal which was transmitted by the reference antenna, as well as calculation of the magnitude of the transmission signal which is transmitted by the at least one transmitting antenna and received by the active antenna, with reference to the at least three power values.

4. The method according to claim 3, wherein repeating the previous ST3 and the phase change and/or amplitude change is performed successively as often as required until at least one power value in each case is captured for at least three or at least four different phase values between the transmission signal on the at least one transmitting antenna and the transmission signal on the reference antenna and/or for at least three or at least four different amplitude values of the transmission signal on the at least one transmitting antenna and/or of the transmission signal on the reference antenna.

5. The method according to claim 3, wherein when the phase change is carried out multiple times for successive phase changes of 0°, Δ°, 2·Δ° and 3·Δ°, wherein Δ° is in the range between 80° and 100° and can correspond to 90°, are applied between the transmission signal of the at least one transmitting antenna and the transmission signal on the reference antenna.

6. The method according to claim 3, including spacing apart the individual phase values which the phase controller sets for a solid angle (θ, φ) one after the other, from one another by α°, wherein $$\alpha° = \frac{360°}{\text{number of phase values}}.$$

7. The method according to claim 1, wherein:
rotating and/or adjusting the active antenna and reference antenna, consists of one unit, relative to the at least one transmitting antenna, so that different reception directions can be measured; and
the method further comprises performing ST1 and/or ST2 and/or ST3 or carrying out the sequences a) or b) or c).

8. The method according to claim 7, wherein within the rotating and/or adjusting the unit comprising the active antenna and the reference antenna is rotated and/or adjusted jointly with respect to its azimuth angle (φ) and/or its angle of elevation (θ) relative to the at least one transmitting antenna.

9. The method according to claim 7, further comprising: repeating the steps of rotation and carrying out as often as required until the magnitudes and the phases for the required solid angles (θ, φ) or for all solid angles (θ, φ) are determined.

10. The method according to claim 1, further comprising:
using an amplitude controller which is connected between the signal generator and the at least one transmitting antenna and/or between the signal generator and the reference antenna;
setting the amplitude of the transmission signal on the at least one transmitting antenna and/or the transmission signal on the reference antenna in such a way that the power level of a transmission signal is less than 20 times as high as the power of the other transmission signal at the location of the active antenna.

11. The method according to claim 1, further comprising:
arranging the reference antenna on the active antenna in such a way that the spacing between the reference antenna and the active antenna is less than 100 cm.

12. Method according to claim 1, including using the at least one transmitting antenna and/or the reference antenna to transmit a modulated or unmodulated transmission signal.

13. A measuring device for determining power values of a signal received by an active antenna for calculation of magnitude and phase, comprising:
at least one transmitting antenna and a reference antenna, wherein the reference antenna is disposed at a predetermined position and a predetermined spacing relative to the active antenna;
a signal generator configured to produce a transmission signal, wherein the signal generator is connected to the at least one transmitting antenna and to the reference antenna;
a controller which, with the same orientation and position of the active antenna and the reference antenna in relation to the at least one transmitting antenna, is designed and connected to the active antenna and the signal generator and further configured to control the at least one transmitting antenna, reference antenna, and signal generator to:
ST1: only transmit the transmission signal by the at least one transmitting antenna and capture a power value of the transmission signal received by the active antenna;
ST2: only transmit the transmission signal by the reference antenna and capture a power value of the transmission signal received by the active antenna;
ST3: simultaneously transmit the transmission signal by the at least one transmitting antenna and the reference antenna while generating superimposed transmission signals and capture of a power value of the superimposed transmission signals received by the active antenna;
wherein the controller is configured to perform the above sequence in any order and in any combination, including performing at least one of ST1, ST2 and ST3 multiple times, wherein the controller always performs ST3 at least once for each sequence.

14. The measuring device according to claim 13, wherein the controller is also designed and configured in such a way that:
for capture of the at least three power values and thus for determination of the magnitude and phase, at least one of the following three sequences a) or b) or c) with the same orientation and position of the active antenna and reference antenna in relation to the at least one transmitting antenna is carried out:
a):
carrying out ST1 or ST2;
carrying out ST3;

repeating ST3 until overall at least three power values are captured;

or:

b)
  carrying out ST1;
  carrying out ST2;
  carrying out ST3;

or:

c)
  carrying out ST3;
  repeating ST3 until overall at least three power values are captured.

15. The measuring device according to claim 14, wherein:

a):
  the measuring device has a phase controller and/or an amplitude controller which is connected between the signal generator and the at least one transmitting antenna and/or between the signal generator and the reference antenna and is controllable by the controller;
  the controller is designed and configured to:
    carry out ST1 or ST2;
    carry out ST3;
    carry out a phase change between the transmission signal on the at least one transmitting antenna and the transmission signal on the reference antenna and/or carry out an amplitude change of the transmission signal on the at least one transmitting antenna and/or of the transmission signal on the reference antenna;
    repeat the previous ST3 and the phase change and/or amplitude change until at least one power value in each case is captured for at least two different phase values between the transmission signal on the at least one transmitting antenna and the transmission signal on the reference antenna and/or for at least two different amplitude values of the transmission signal on the at least one transmitting antenna and/or of the transmission signal on the reference antenna;
    calculate the phase difference on the active antenna between the transmission signal which was transmitted by the at least one transmitting antenna and the transmission signal which was transmitted by the reference antenna with reference to the at least three power values, as well as determine the magnitude of the transmission signal which was transmitted by the at least one transmitting antenna and received by the active antenna, by:
    i) the measured result, that is to say the power value from ST1 if this has been carried out and the at least one transmitting antenna alone has transmitted the transmission signal; or
    ii) the at least three power values, if ST2 has been carried out and the reference antenna alone has transmitted the transmission signal;

or b):
  the controller is designed and configured to:
    carrying out ST1;
    carrying out ST2;
    carrying out ST3;
    calculate the phase difference on the active antenna between the transmission signal which was transmitted by the at least one transmitting antenna and the transmission signal which was transmitted by the reference antenna with reference to the at least three power values, and determine the magnitude of the transmission signal which was transmitted by the at least one transmitting antenna and received by the active antenna with the power value from ST1 as only the at least one transmitting antenna has transmitted the transmission signal, or c):
  the measuring device has a phase controller and/or an amplitude controller which is connected between the signal generator and the at least one transmitting antenna and/or between the signal generator and the reference antenna and is controllable by the controller;
  that the controller is designed and configured to:
    carrying out of method step ST3;
    carrying out a phase change between the transmission signal on the at least one transmitting antenna and the transmission signal on the reference antenna and/or carry out an amplitude change of the transmission signal on the at least one transmitting antenna and/or of the transmission signal on the reference antenna:
    repeat the previous ST3 and the phase change and/or amplitude change until at least one power value in each case is captured for at least three different phase values between the transmission signal on the at least one transmitting antenna and the transmission signal on the reference antenna and/or for at least three different amplitude values of the transmission signal on the at least one transmitting antenna and/or of the transmission signal on the reference antenna;
    calculate the phase difference on the active antenna between the transmission signal which was transmitted by the at least one transmitting antenna and the transmission signal which was transmitted by the reference antenna, as well as calculate the magnitude of the transmission signal which was transmitted by the at least one transmitting antenna and received by the active antenna, with reference to the at least three power values.

16. The measuring device according to claim 15, wherein the phase controller is designed and is controllable by the first-mentioned controller in such a way that the power values are captured for at least three or at least four different phase values between the transmission signal on the at least one transmitting antenna and the transmission signal on the reference antenna and/or for at least three or at least four different amplitude values of the transmission signal on the at least one transmitting antenna and/or of the transmission signal on the reference antenna.

17. The measuring device according to claim 15, wherein the controller is designed and configured in such a way as to control the phase controller in such a way that it can set four successive phase changes of 0°, $\Delta°$, $2\cdot\Delta°$ and $3\cdot\Delta°$, wherein $\Delta°$ is in the range between 80° and 100°, between the transmission signal of the at least one transmitting antenna and the transmission signal on the reference antenna.

18. The measuring device according to claim 15, wherein the individual phase values which the phase controller sets for a solid angle (θ, φ) are spaced apart from one another by α°, wherein $$\alpha° = \frac{360°}{\text{number of phase values}}.$$

19. Measuring device according to claim 13, wherein the controller is designed in such a way that the active antenna and reference antenna can be jointly rotated and/or adjusted relative to the at least one transmitting antenna, so that different reception directions, that is to say solid angles (θ, φ) can be measured.

20. The measuring arrangement according to claim 19, wherein the combination comprising the active antenna and the reference antenna is rotatable and/or adjustable jointly with respect to its azimuth angle (φ) and/or its angle of elevation (θ) relative to the at least one transmitting antenna.

21. Measuring device according to claim 13, further comprising an amplitude controller which is connected between the signal generator and the at least one transmitting antenna and/or between the signal generator and the reference antenna and the controller is designed and configured in such a way as to control the amplitude controller in such a way that the amplitude of the transmission signal on the at least one transmitting antenna and/or of the transmission signal on the reference antenna can be set in such a way that the power level of a transmission signal at the location of the active antenna is less than 20 times as high as the power of the other transmission signal.

22. The measuring device according to claim 13, wherein the spacing between the reference antenna and the active antenna is less than 100 cm.

23. The measuring device according to claim 13, further comprising an interface device connected the spacing between the controller and the active antenna.

24. The measuring device according to claim 13, wherein the at least one transmitting antenna and/or the reference antenna is configured to transmit a modulated or unmodulated transmission signal.

\* \* \* \* \*

UNITED STATES PATENT AND TRADEMARK OFFICE
CERTIFICATE OF CORRECTION

PATENT NO. : 9,548,798 B2
APPLICATION NO. : 15/007816
DATED : January 17, 2017
INVENTOR(S) : Fritze et al.

It is certified that error appears in the above-identified patent and that said Letters Patent is hereby corrected as shown below:

In the Specification

In Column 1, Line 7, delete "None." and insert -- This application claims priority to DE Patent Application No. 10 2015 001 002.6 filed 27 January 2015, the entire contents of which is hereby incorporated by reference. --, therefor.

In Column 16, Line 42, delete "antenna" and insert -- antenna 2 --, therefor.

In Column 17, Line 33, delete "$S_3$," and insert -- $S_{3\_1}$ --, therefor.

In the Claims

In Column 24, Line 25, in Claim 3, delete "as well" and insert -- as well as --, therefor.

In Column 25, Line 3, in Claim 3, delete "antenna:" and insert -- antenna; --, therefor.

In Column 29, Line 15, in Claim 20, delete "arrangement" and insert -- device --, therefor.

Signed and Sealed this
Twenty-ninth Day of December, 2020

Andrei Iancu
*Director of the United States Patent and Trademark Office*